United States Patent [19]
Kim

[11] Patent Number: 5,398,195
[45] Date of Patent: Mar. 14, 1995

[54] METHOD AND SYSTEM FOR PROVIDING A NON-RECTANGULAR FLOOR PLAN

[75] Inventor: Michelle Y. Kim, Scarsdale, N.Y.

[73] Assignee: International Business Machines Corporation, Armonk, N.Y.

[21] Appl. No.: 810,260

[22] Filed: Feb. 21, 1992

[51] Int. Cl.$^6$ .............................................. G06F 15/60
[52] U.S. Cl. .................................. 364/491; 364/488; 364/489; 364/490
[58] Field of Search .............................. 364/488–491, 364/578

[56] References Cited

U.S. PATENT DOCUMENTS

| | | | |
|---|---|---|---|
| 4,554,625 | 11/1985 | Otten | 364/148 |
| 4,593,363 | 6/1986 | Burstein et al. | 364/491 |
| 4,630,219 | 12/1986 | DiGiacomo et al. | 364/488 |
| 4,791,586 | 12/1988 | Maeda et al. | 364/491 |
| 4,805,113 | 2/1989 | Ishii et al. | 364/491 |
| 4,829,446 | 5/1989 | Draney | 364/488 |
| 4,872,103 | 10/1989 | Kingsley | 364/153 |
| 4,918,614 | 4/1990 | Modarres et al. | 364/490 |
| 5,047,949 | 9/1991 | Yamaguchi et al. | 364/491 |
| 5,050,091 | 9/1991 | Rubin | 364/488 |
| 5,062,054 | 10/1991 | Kawakami et al. | 364/491 |
| 5,140,402 | 8/1992 | Murakata | 357/45 |
| 5,191,542 | 3/1993 | Murofushi | 364/491 |
| 5,224,056 | 6/1993 | Chene et al. | 364/490 |

OTHER PUBLICATIONS

"Floor Planning and Global Routing in an Automated Chip Design System", by Yu-Chin Hsu, Report No. UIUCDCS-R-87-1353, Computer Science Thesis, University of Illinois; (1987).

"Overlap Resolution Problem for Block Placement in VLSI Layout", Ohmura, et al, *Electronics and Communications in Japan*, Part 3, vol. 72, No. 6 (1990) pp. 68–76.

"A Block Placement Procedure Using a Force Model", Onodera, et al, *Electronics and Communications in Japan*, Part 3, vol. 72, No. 11, (1989) pp. 87–96.

"CHAMP: Chip Floor Plan for Hierarchical VLSI Layout Design", Ueda, et al, *IEEE Transactions on Computer-Aided Design*, vol. CAD-4, No. 1, (Jan. 1985) pp. 12–22.

"New Algorithms for the Rectilinear Steiner Tree Problem", Ho, et al, *IEEE Transactions on Computer-Aided Design*, vol. 9, No. 2, (Feb. 1990) pp. 185–193.

"Algorithm for VLSI Chip Floor Plan", Ueda, et al, *Electronics Letters*, vol. 19, No. 3, (Feb. 1983) (pp. 77–78).

*Primary Examiner*—Vincent N. Trans
*Assistant Examiner*—Leigh Marie Garbowski
*Attorney, Agent, or Firm*—Heslin & Rothenberg

[57] ABSTRACT

A floor planning technique is provided herein wherein an initial floor plan having a predefined area and a number of overlapping modules is used to produce a final floor plan having the same predefined area and no overlapping modules. In order to eliminate the overlaps, a two stage process is performed. The first stage includes minimizing the overlaps by performing a series of move and/or reshape operations on the overlapping modules. The amount an overlapping module is moved and/or reshaped is based upon a computed net repelling force. After the move and/or reshape operations no longer minimize overlaps, the second stage is performed. The second stage, referred to as fitting, fits each overlapping module into the predefined area by awarding the overlapping area to the module or protruding the overlapping module into available space surrounding the module. The space that a module extends into is determined by calculating attracting forces. Once the second stage is complete, the resulting floor plan is legal having no overlapping modules.

55 Claims, 17 Drawing Sheets

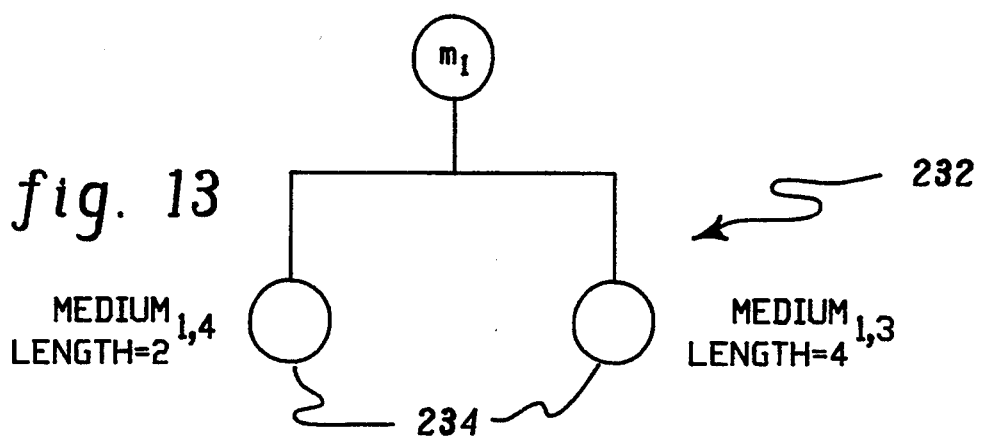
fig. 13
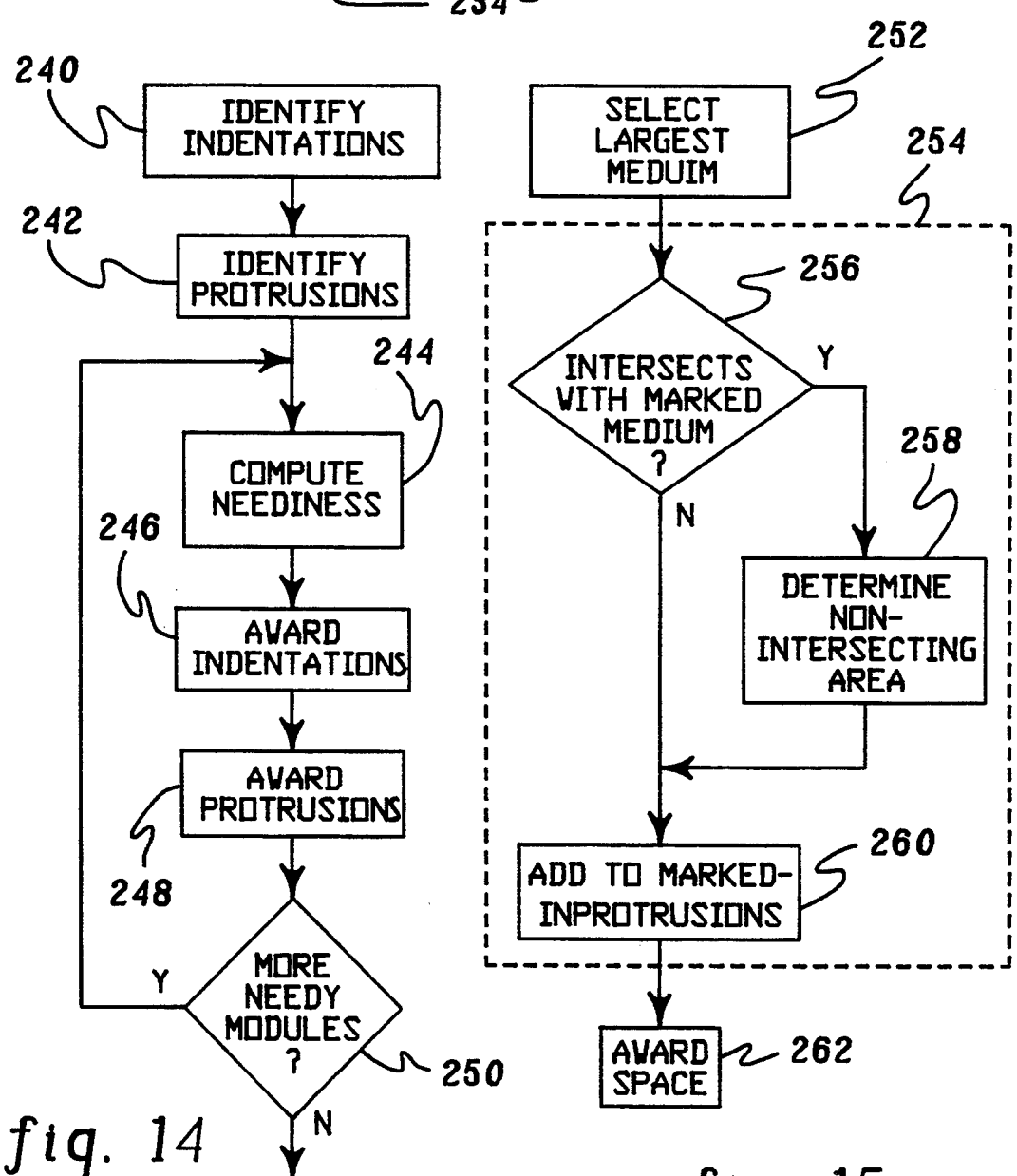
fig. 14
fig. 15

METHOD AND SYSTEM FOR PROVIDING A NON-RECTANGULAR FLOOR PLAN

TECHNICAL FIELD

The present invention relates in general to layout or floor planning techniques and, in particular, to a method and system for providing a non-rectangular floor plan.

BACKGROUND ART

In the past, many floor planning techniques have been implemented in which a number of rectangular blocks or modules are arranged such that they require a minimum amount of area.

For example in U.S. Pat. No. 4,554,625 entitled "Method for Generating an Optimized Nested Arrangement of Constrained Rectangles" issued on Nov. 19, 1985 and assigned to International Business Machines Corporation, a method for generating an overall arrangement of a number of non-overlapping rectangles having constraints on their size and shape is disclosed. The method includes assembling a number of rectangles, each limited by a shape constraint, into one enveloping rectangle, in which the dimensions of the rectangle are to be minimized.

In U.S. Pat. No. 4,918,614 entitled "Hierarchial Floorplanner," issued on Apr. 17, 1990 and assigned to LSI Logic Corporation, a system is described in which logic and/or memory elements are automatically placed on an integrated circuit taking into account the constraints imposed by the logic designer. The system includes means for estimating the size of the elements which have not been laid out and for partitioning groups of elements into successively smaller "slices" of the integrated circuit until all the elements are placed relative to one another. The system also includes means for determining the precise shapes of elements on the integrated circuit based upon the relative placement of such elements and upon the additional area required for routing among such elements. The system attempts to place the elements in such a way that the required amount of area to place all the elements is minimized.

Floor planning or layout design is used in a variety of situations including, but not limited to, architectural planning, computer chip design and any situations in which it is required to place a number of modules or blocks within a minimum amount of area or a prespecified amount of area.

Floor planning is considered quite difficult especially when the solution requires fitting a plurality of modules into a prespecified amount of area, which is not to be altered. The techniques used in situations where the objective is to fit the modules within a minimum amount of area are not successful in solving this problem (of fitting the modules into a prespecified amount of area). Their lack of success is due to the fact that these techniques are incapable of altering the rectangular shape of the modules and thus, they cannot adequately use the permitted amount of space.

Therefore, a need exists for a floor planning technique in which a given number of modules are fit into a predefined area with no overlaps while allowing the modules to deviate from basic rectangular shapes. Further, a need exists for providing such a floor plan in which the spatial constraints of the modules within the layout are satisfied and a given neighborhood relationship is preserved. A further need exists for automating the floor planning technique or layout design such that the modules or blocks may be placed within the predefined area with no overlaps in a relatively short amount of time.

DISCLOSURE OF INVENTION

The shortcomings of the prior art are overcome and additional advantages are provided in accordance with the principles of the present invention through the provision of a method and system for providing a non-rectangular floor plan.

In accordance with the principles of the present invention, a method for legalizing a valid floor plan within a defined area having a plurality of modules is provided. The method includes repetitively performing at least one of a move operation and a reshape operation on each overlapping module in order to reduce the amount of total overlap among the plurality of modules, and fitting each remaining overlapping module into the plan by at least one of indenting and protruding until a legal floor plan results therefrom.

In one embodiment, at least one plurality of move operations is performed so as to produce a variety of floor plans. From the variety of floor plans, the plan having the least amount of overlap is selected and a reshape operation is performed thereon. The extent of each move operation and reshape operation varies according to a computed net repelling force for each overlapping module. The magnitude and direction of the computed net repelling force for any particular module is dependent upon the location and severity of the overlaps affecting that module.

In one embodiment, the net repelling force has a net horizontal component and a net vertical component and is determined by calculating a set of repelling forces for each overlapped module. Each of the repelling forces within the set has a horizontal component with a magnitude and a direction and a vertical component with a magnitude and a direction. From the set of repelling forces, a maximum and a minimum horizontal component and a maximum and a minimum vertical component are selected. The maximum and minimum horizontal components are used to calculate the net horizontal component of the net repelling force and the maximum and minimum vertical components are used to calculate the net vertical component of the net repelling force.

In one embodiment, the fitting step includes the step of calculating a plurality of attracting forces for each of the remaining overlapping modules. The step of calculating a plurality of attracting forces includes determining a plurality of modules attracted to each of the remaining overlapping modules and calculating a gravitational medium for each of the attracted modules.

In one embodiment, in order to determine a plurality of modules attracted to each of the remaining overlapping modules, a rectangle cross section for each of the overlapping modules is defined such that a number of regions is defined for each of the overlapping modules. A module which is located wholly or partially within each region is identified and then a determination is made as to which of the modules in each region are distant modules.

In yet another aspect of the invention, a system for legalizing a valid floor plan within a defined area having a plurality of modules is provided. The system includes means for repetitively performing at least one of a move operation and a reshape operation on each overlapping module in order to reduce the amount of total overlap among the plurality of modules, and means for fitting each remaining overlapping module into the plan by at least one of indenting and protruding until a legal floor plan results therefrom.

BRIEF DESCRIPTION OF DRAWINGS

The subject matter which is regarded as the invention is particularly pointed out and distinctly claimed in the claims at the conclusion of the specification. The invention, however, may best be understood by reference to the following detailed description taken in conjunction with the accompanying drawings in which:

FIG. 13 depicts one example of an attraction tree constructed in accordance with the principles of the present invention;

FIG. 14 illustrates a block diagram of one example of the steps associated with fitting, in accordance with the principles of the present invention;

FIG. 15 illustrates a block diagram of one embodiment of the steps associated with awarding a protrusion, in accordance with the principles of the present invention;

BEST MODE FOR CARRYING OUT THE INVENTION

Figure 1A:
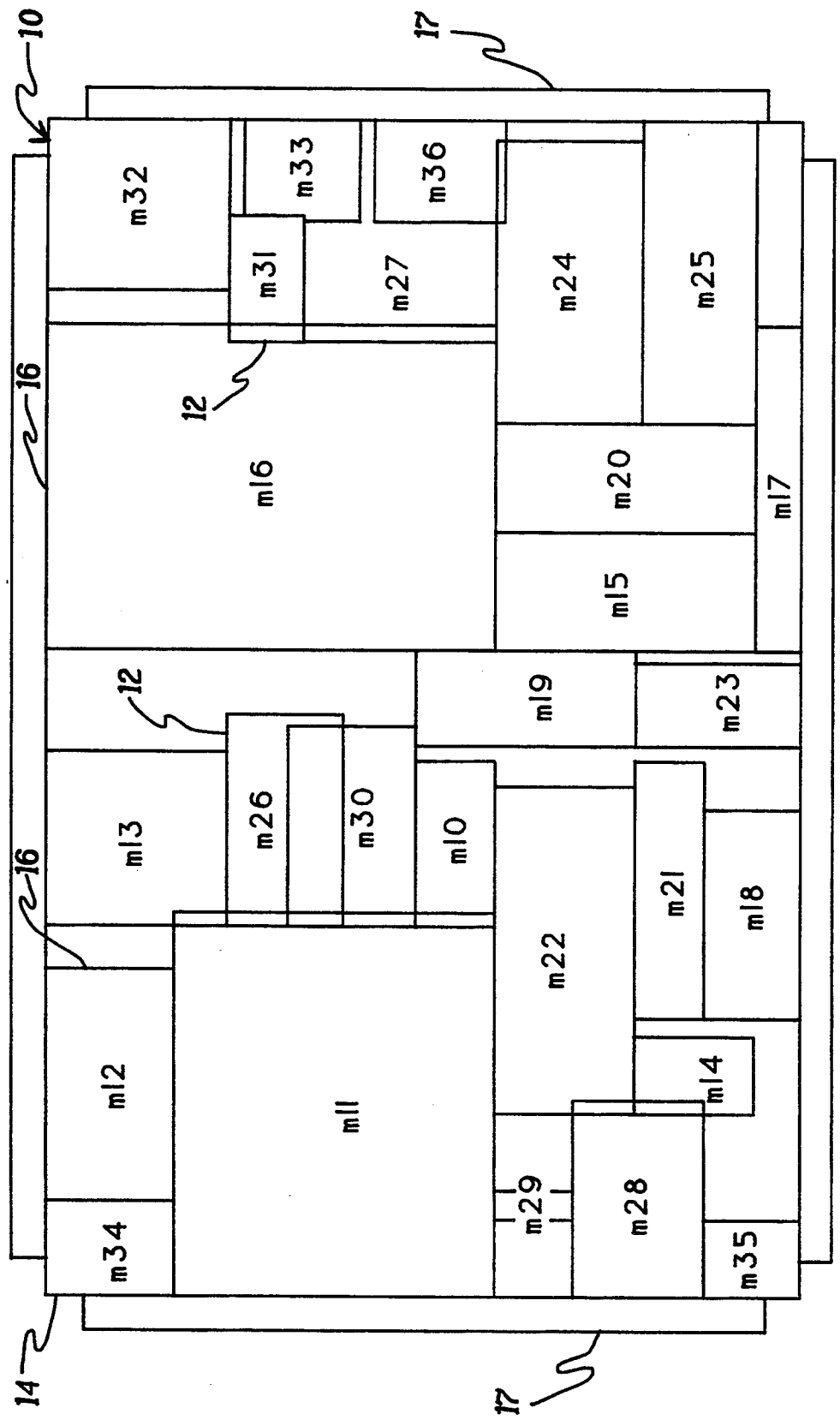
FIG. 1A depicts an initial floor plan having overlapping modules.
Figure 1B:
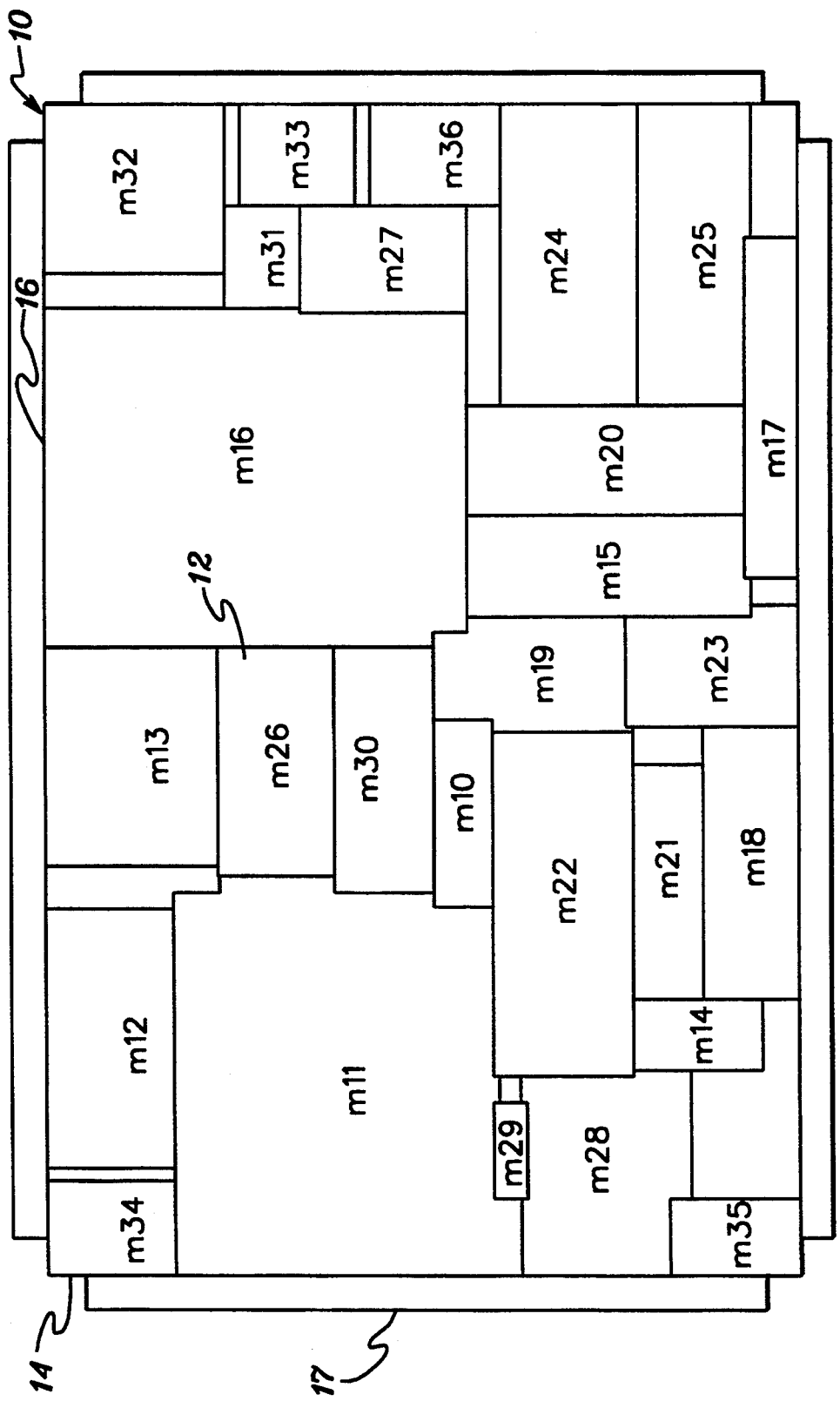
FIG. 1B depicts a final floor plan having no overlapping modules in accordance with the principles of the present invention.

In general, in accordance with the principles of the present invention, a floor planning technique is provided wherein an initial floor plan (see, for example, FIG. 1A) having a fixed predefined area 10 and a number of overlapping two-dimensional modules (or blocks) 12, is used to produce a final floor plan having the same predefined area and no overlapping modules (see, for example, FIG. 1B). The initial floor plan may have one or more fixed shaped modules 14 (e.g., $m_{32}$, $m_{33}$, $m_{34}$, $m_{35}$ and $m_{36}$) and/or one or more flexible shaped modules 16 (e.g., $m_{11}$, $m_{12}$, $m_{13}$, $m_{22}$ and $m_{29}$). In one embodiment, fixed shaped modules are defined as those modules having equal upper and lower bounds on their respective aspect ratios (i.e., upper($m_i$)=lower($m_i$), wherein $m_i$ is an element of the set of M modules), and flexible shaped modules are defined as those modules having unequal lower and upper bounds on their respective aspect ratios. The aspect ratio of a module is defined as the ratio of its horizontal and vertical dimensions. A fixed shaped module is said to be preplaced within the floor plan when the coordinates of that module are fixed and cannot be altered. As one example, modules $m_{32}$ and $m_{34}$ are preplaced within the initial floor plan and thus, cannot be moved or altered.

Each of the modules within the initial plan is, for instance, rectangular and each is horizontally and vertically aligned within predefined area 10. As one example, predefined area 10 is also rectangular. Each module has a set of minimum spatial constraints, including a minimum area requirement and a prespecified range of aspect ratios. In addition, in one example, the modules are placed relative to one another providing a neighborhood relationship, which is to be preserved in the final floor plan. In general, the relative placement is preserved by allowing a module to move or reshape (as explained in detail further below), but not to jump over another module. (It will be apparent to those of ordinary skill in the art, that the teachings herein can be applied to a floor plan wherein the modules are not horizontally and vertically aligned.)

The initial floor plan is said to be valid if the spatial constraints of the modules are satisfied, the preplaced modules are kept at their required coordinates and the plan fits within the predefined area. A valid initial plan may have a number of overlapping modules. The floor planning technique of the present invention assumes that the initial floor plan is valid. The valid plan is used to produce a final legal plan in which the floor plan is valid and has no overlaps. In order to produce such a plan, one or more of the modules may deviate from its rectangular shape, thereby producing a non-rectangular floor plan. A non-rectangular module is created either by removing one or more rectangular portions from a given module, and/or by connecting additional rectangular portions to it (to be explained more fully below).

In one embodiment, the floor planning technique of the present invention adds a number of guardian modules 17 to the boundaries of predefined area 10. In one example, four modules are added to protect the four boundaries of the predefined area by preventing any other modules from crossing the boundaries. (The manner in which this is accomplished is explained further below.) The guardian modules cannot be moved or altered.

Figure 2:
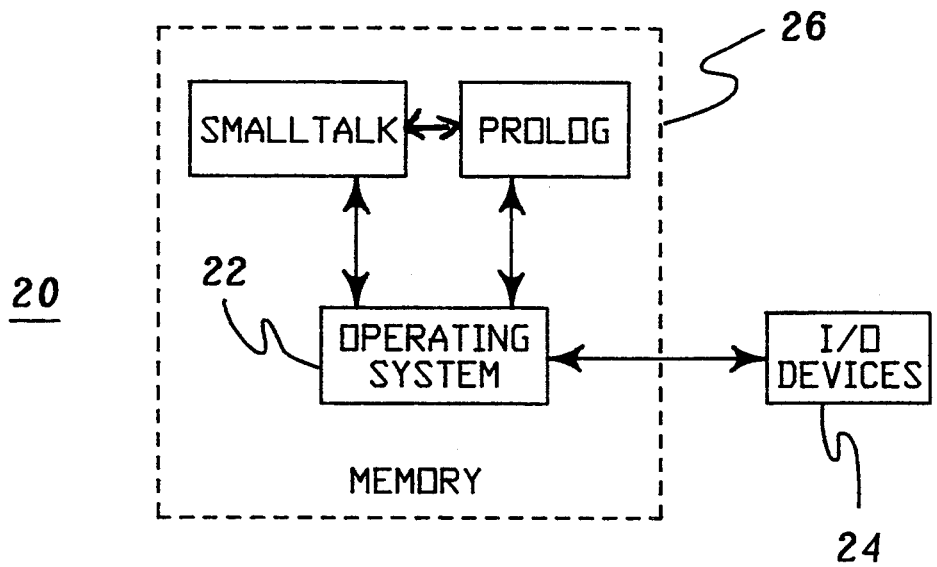
FIG. 2 depicts a block diagram of one embodiment of the hardware components associated with the floor planning technique of the present invention.

One generalized embodiment of a floor planning processing system, denoted 20, is depicted in FIG. 2. As shown, system 20 includes an operating system 22, one or more input/output devices 24 and a memory 26. Located within memory 26 is operating system 22 which is, for example, the OS2 processing system offered by International Business Machines Corporation, and two programming languages including Smalltalk which is a product of Digitalk, Incorporated and PROLOG (PROgramming LOGic), a product of International Business Machines Corporation.

In one embodiment, system 20 is interactive in that a command or a request entered at input/output devices 24 is received and processed by operating system 22, which references Smalltalk and PROLOG. Smalltalk and PROLOG cooperate as a client and a server, respectively. That is, Smalltalk can request that PROLOG prove a goal in a given context, and PROLOG can request that Smalltalk create objects and call methods to prove the goal. In Smalltalk, a class that represents PROLOG and a set of related methods have been added to capture requests to PROLOG, and in PROLOG, three predicates have been defined which facilitate passing messages to and from Smalltalk. These predicates include "create" for instant creation, "assign" for instant variable assignment and "query" for Smalltalk method invocation.

Figure 3:
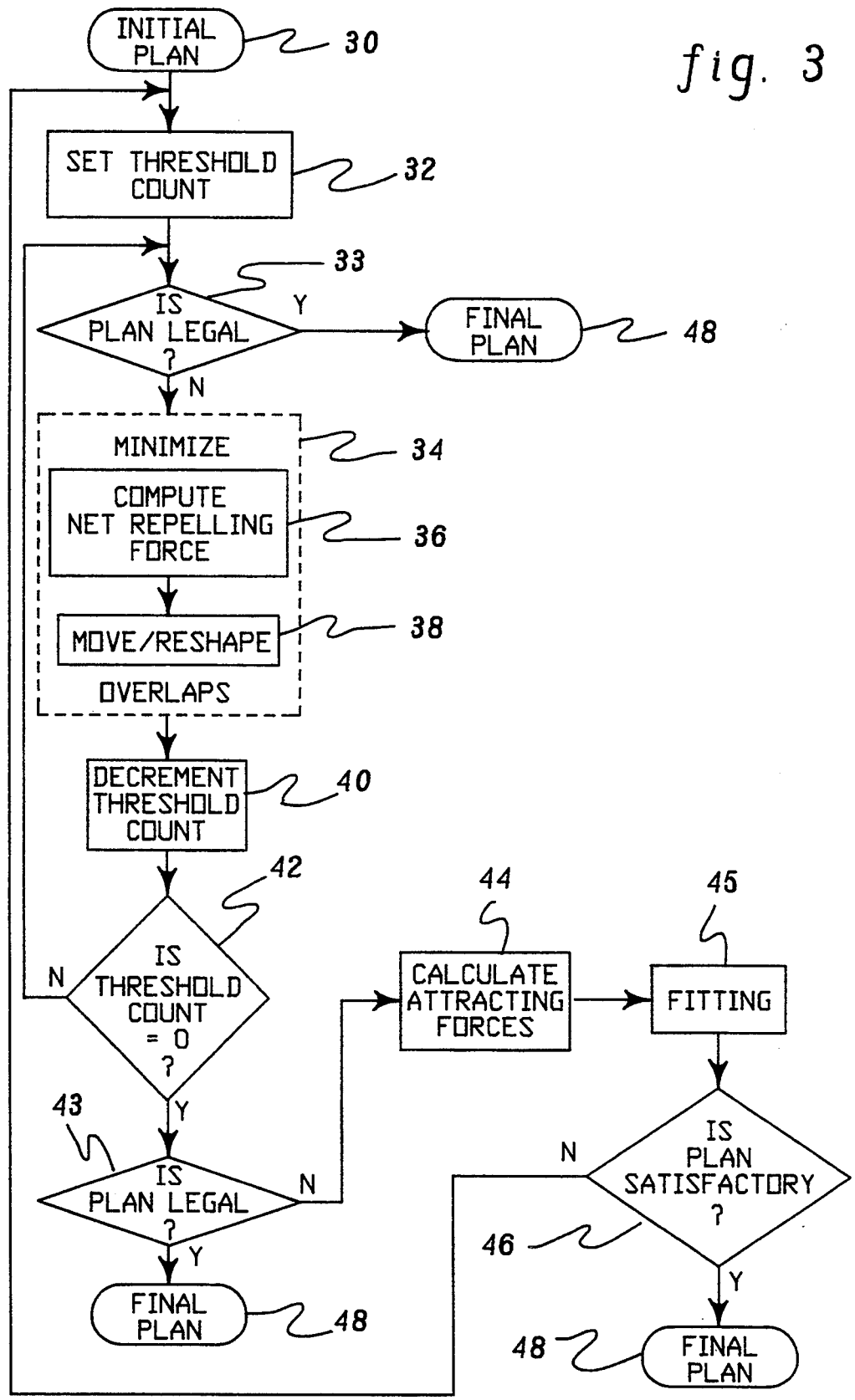
FIG. 3 illustrates a block diagram of one embodiment of the main processing steps of the floor planning technique of the present invention.

Referring to FIG. 3, the main processing steps of the floor planning technique of the present invention are described. In one preferred embodiment, the method of the present invention begins with an initial valid floor plan, STEP 30 "Initial Plan," and produces therefrom a final legal plan, STEP 48 "Final Plan." In order to accomplish this task, a threshold count is set, STEP 32 "Set Threshold Count" so that the processing steps required to produce a satisfactory final layout may be performed iteratively until such a layout or floor plan is produced (layout or floor plan may be used interchangeably herein). The value of the threshold count is typically between 50 and 5000 and is dependent on a number of factors including the density of predefined area 10 and/or the complexity of the floor plan.

Subsequent to setting the desired threshold count, in one embodiment, it is determined whether the plan is legal, INQUIRY 33 "Is Plan Legal?" That is, whether the plan is valid and has no overlapping modules. If the plan is legal, then processing ceases, STEP 48 "Final Plan." If, however, the plan is not legal, then the process of using repelling forces to minimize the amount of overlapping modules within predefined area 10 begins, STEP 34 "Minimize Overlaps."

Figure 4:
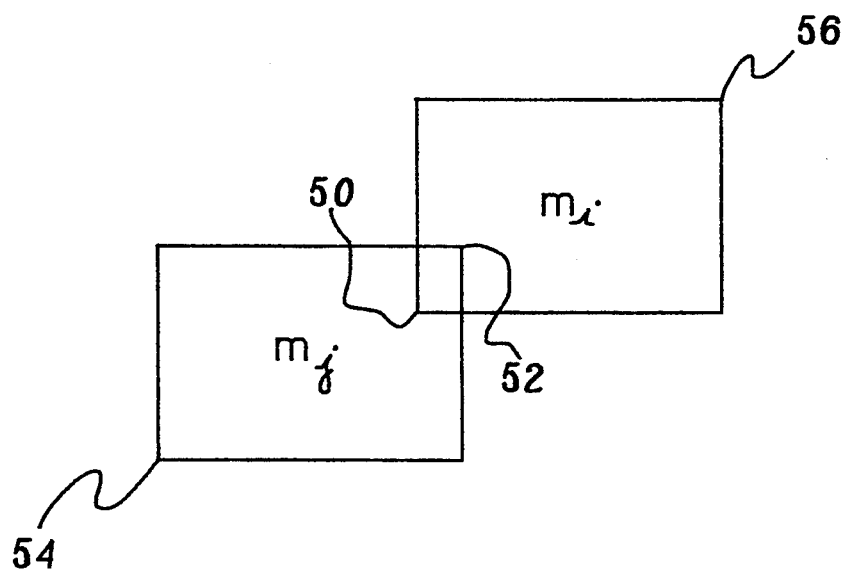
FIG. 4 depicts a pair of overlapping modules.

A pair of modules, $m_i$ and $m_j$, overlap only if none of the following inequalities is true:

(1) left($m_i$) ≧ right($m_j$) wherein:
left($m_i$) represents the x coordinate of origin ($m_i$), and origin($m_i$) represents the lower left corner of $m_i$, as depicted in FIG. 4 at reference numeral 50; and right($m_j$) represents the x coordinate of corner($m_j$), and corner($m_j$) represents the upper right corner of $m_j$, as depicted in FIG. 4 at reference numeral 52;

(2) left($m_i$) ≧ right($m_i$) wherein:
left($m_j$) represents the x coordinate of origin ($m_j$), and origin($m_j$) represents the lower left corner of $m_j$ (see reference numeral 54); and
right($m_i$) represents the x coordinate of corner($m_i$), and corner($m_i$) represents the upper right corner of $m_i$ (see reference numeral 56);

(3) bottom($m_i$) ≧ top($m_j$) wherein:
bottom($m_i$) represents the y coordinate of origin ($m_i$); and
top($m_j$) represents the y coordinate of corner ($m_j$);

(4) bottom($m_j$) ≧ top($m_i$) wherein:
bottom($m_j$) represents the y coordinate of origin($m_j$); and
top($m_i$) represents the y coordinate of corner ($m_i$).

Should none of the inequalities prove to be true, then it is said that $m_i$ and $m_j$ overlap. In particular, $m_i$ overlaps $m_j$ ($m_i$ is the overlapping module and $m_j$ is the overlapped module) and the area that overlaps is referred to herein as overlapArea. OverlapArea is in the shape of a rectangle having a width and a height and may be represented by its origin and corner points.

When a pair of modules, such as $m_i$ and $m_j$ overlap, there are repelling forces between the pair which cause the modules to push each other away. (As used herein, the term "repelling forces" is a mathematical construct used as a convenient way of quantifying the amount by which a module must be moved to eliminate an overlap. The term "force" is not used in its conventional manner.) In order to determine the amount one module pushes another module, a net repelling force for each overlapping module is computed, STEP 36 "Compute Net Repelling Force" (FIG. 3). The steps involved in one embodiment of calculating each net repelling force will now be described in detail with reference to FIG. 5.

In accordance with the principles of the present invention, one step involved in computing each net repelling force is calculating an overlap force indicative of each overlapArea, STEP 68 "Calculate Overlap Area Force." In order to calculate this force, a vector, referred to herein as overlap($O_x, O_y$), is obtained for each overlapArea. $O_x$ represents a horizontal component, and $O_y$ represents a vertical component of the overlap force. $O_x$ and $O_y$ each have a magnitude and a direction. The magnitudes of the horizontal and vertical components are equal to the absolute value of the width of the overlapArea and the absolute value of the height of the overlapArea, respectively. The direction of each of the components is determined relative to the center points of the overlapping module and the overlapArea.

Figure 6A:
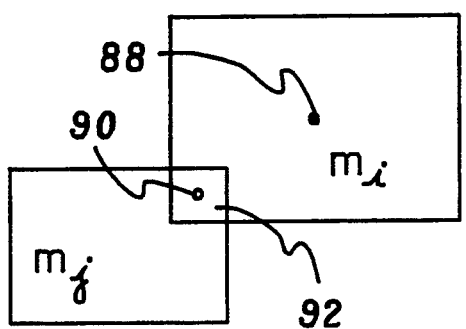
FIGS. 6a–6d illustrate various relative positions of the center point of an overlapping module and a center point of the overlap area.

For instance, referring to FIG. 6a, if a center point 88 of an overlapping module $m_i$ were to the left of a center point 90 of an overlapArea 92, then $O_x$ would be a negative force (along the x axis). Similarly, if Center point 88 were to the right of center point 90, then $O_x$ would be a positive force. In the example shown in FIG. 6a, since point 88 is to the right of point 90, $O_x$ is a positive force. Further, if point 88 were above point 90, then $O_y$ would be a positive force, and if center point 88 were below center point 90, then $O_y$ would be a negative force (along the y axis). Once again, referring to the example in FIG. 6a, since point 88 is above point 90, $O_y$ is also a positive force.

Figure 6B:
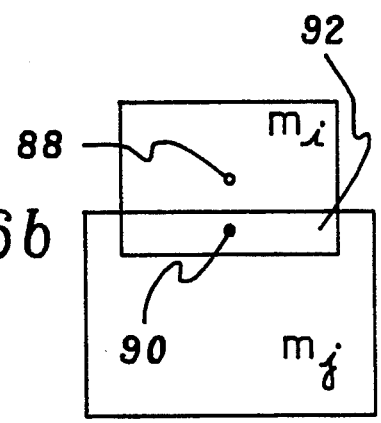
Figure 6C:
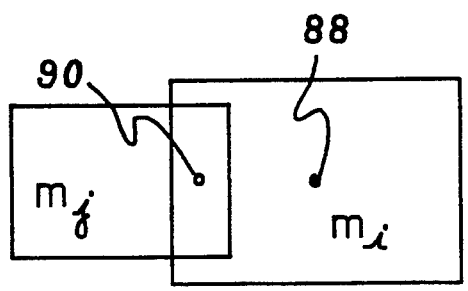

If, on the other hand, center point 88 of the overlapping module $m_i$ is aligned with center point 90 of overlapArea 92 such that it is neither to the right nor left of point 90 (see FIG. 6b), then the direction of $O_x$ is chosen at random. Similarly, if center point 88 is neither above nor below point 90 (FIG. 6c), then the direction of $O_y$ is randomly selected.

Figure 5:
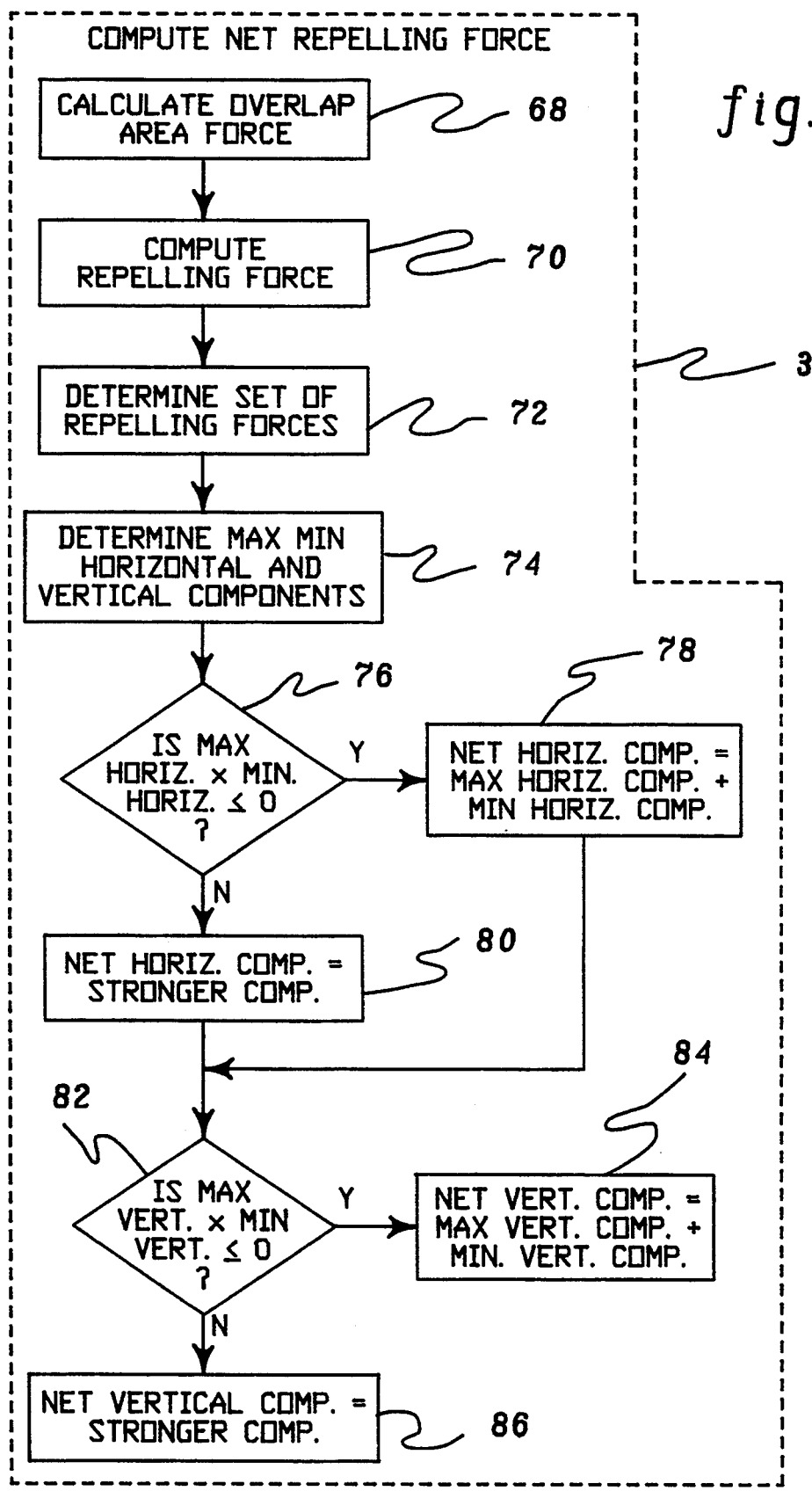
FIG. 5 illustrates a block diagram of one embodiment of the processing steps for calculating a net repelling force, in accordance with the principles of the present invention.

The above-calculated overlap force, having components $O_x$ and $O_y$, is used in the next step of computing a net repelling force (FIG. 5), which is computing a repelling force for each overlapping module, STEP 70 "Compute Repelling Force" (FIG. 5). This force, $f_{i,j}(F_x,F_y)$ represents a minimum change necessary to remove the overlap. Therefore, in calculating the repelling force of, for example, module $m_i$ (FIG. 6a), the horizontal or vertical component of the overlap force having the lesser magnitude is selected and used in computing either the respective horizontal or vertical component of the repelling force for $m_i$. The component which is greater and therefore, not selected is represented as zero in the repelling force. In other words, if the absolute value of $O_x$ is less than the absolute value of $O_y$, then the value of $O_x$ (including direction) is selected and used in determining the horizontal component of the repelling force. In particular, the horizontal component of the repelling force is determined by, for example, dividing the value of the horizontal component of the overlap force in half. In addition, the vertical component is set to zero. Stated another way:

if $abs(O_x) < abs(O_y)$, $F_x := O_x \div 2$ and $F_x := 0$, where $F_x, F_y$ represent the horizontal and vertical components of the repelling force, respectively, and := is equivalent to "assigned the value of."

On the other hand:

if $abs(O_y) < abs(O_x)$, $F_y := O_y \div 2$ and $F_x := 0$.

The method described above ensures that the value of the repelling force for module $m_i$ represents the minimum change necessary to remove the overlap. The selected $O_x$ or $O_y$ is divided in half because in most cases module $m_i$ only needs to move half the distance to remove the overlap, since module $m_j$ may move the other half. However, in some cases, $m_j$ cannot move because it is a preplaced or a guardian module, thus, the force on $m_i$ is not divided in half. Instead the full force is used.

Should the absolute value of $O_x$ equal the absolute value of $O_y$ ($abs(O_x) = abs(O_y)$), then one of the two components is randomly selected and the other component is set to zero.

Figure 6D:
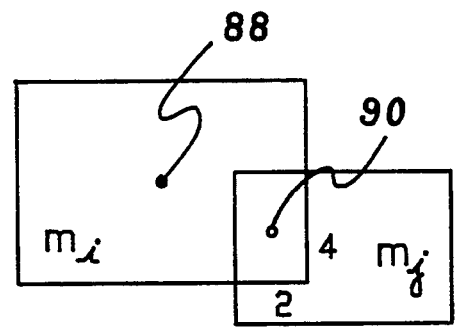

To further enhance the previous discussion of steps 68 "Calculate Overlap Area Force" and 70 "Compute Repelling Force," the following example is offered (refer to FIG. 6d):

(a) To calculate the overlapArea force (STEP 68), obtain overlap ($O_x, O_y$). Referring to FIG. 6d, it is shown that the width of the overlapArea is 2 and that center point 88 of module $m_i$ is to the left of point 90 of overlapArea. Thus, $O_x$ is in the negative direction and equal to $-2$. It is also shown that the height of the overlapArea is 4 and that center point 88 is above point 90, and thus $O_y = +4$. Therefore, the vector overlap ($O_x, O_y$) is represented as overlap $(-2,4)$.

(b) To compute the repelling force for $m_i$ (STEP 70), obtain $f_{i,j}(F_x,F_y)$ (assumes $m_j$ is not a preplaced or a guardian module):

Since $abs(-2) < abs(4)$, $F_x := -2 \div 2$ and $F_y := 0$. Thus, the repelling force of $m_i$ is represented as $f_{i,j}(-1,0)$.

Figure 6E:
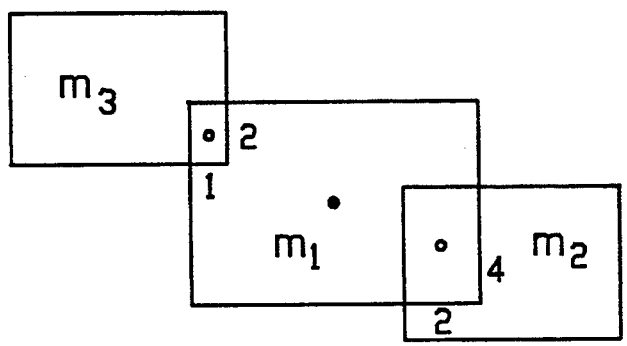
FIG. 6e illustrates an overlapping module with a plurality of overlapped neighbors.

Referring again to FIG. 5, the next step in computing the net repelling force for each overlapping module is determining a set of repelling forces for each overlapping module, STEP 72 "Determine Set of Repelling Forces." Any given overlapping module, such as $m_1$ (FIG. 6e) may have a number of overlapped neighbors, such as $m_2$ and $m_3$. The number of repelling forces for module $m_1$ is equal to the number of overlapped neighbors and thus, in this one example, $m_1$ has two repelling forces. The two repelling forces associated with $m_1$ represent a set of repelling forces for $m_1$. This set of forces can be divided into two subsets: one subset including all the horizontal components of the set of forces and the other subset including all the vertical components of the set. Each of the subsets is preferably ordered such that the smallest value is first. For instance, using the previously described procedures, it is determined that the set of repelling forces for $m_1$ is represented by $FSET_1 = ((-1,0),(0.5,0))$ and therefore, the subset of horizontal components $FxSet_1 = -1,0.5$ and the subset of vertical components $FySet_1 = 0,0$.

Subsequent to obtaining the set of repelling forces for each overlapping module, a maximum and minimum horizontal component is selected from the horizontal subset and a maximum and minimum vertical component is selected from the vertical subset, STEP 74 "Determine MAX MIN Horizontal and Vertical Components." By analyzing these selected components, information may be gained concerning the characteristics of combining the repelling forces in each set, e.g., $FSet_1$. For instance, if the maximum horizontal component is greater than 0 and the minimum horizontal component is less than 0, then there is a cancelling effect among the components. However, if the maximum and minimum horizontal components are greater than 0, then the maximum horizontal component subsumes the minimum horizontal component. Similarly, if the maximum and minimum components are less than 0, then the minimum horizontal component subsumes the maximum horizontal component. The same characterizations are true for the vertical components.

In addition, if the absolute value of a horizontal component $F_i$ (or a vertical component $F_i$) is less than the absolute value of a horizontal component $F_j$ (or a vertical component $F_j$), then the horizontal component $F_j$ (or vertical component $F_j$) is said to be stronger than the horizontal component $F_i$ (or vertical component $F_i$). This means that if the $F_i$ and $F_j$ components are in the same direction, then the $F_j$ component subsumes the $F_i$ component; otherwise, there is a cancelling effect.

Referring once again to FIG. 6e and the subsets, $FxSet_1 = -1,0.5$ and $FySet_1 = 0,0$, in this illustrative example, the maximum horizontal component = 0.5 and the minimum horizontal component = $-1$ ($-1$ being stronger than 0.5), while the maximum and minimum vertical components = 0.

In the next step, the product of the maximum and minimum horizontal components is used in deciding how to compute the net horizontal component for module $m_1$, Inquiry 76 "Is MAX Horiz. $\times$ MIN Horiz. $\leq 0$?" Should the product be less than or equal to zero, then the net horizontal component is equal to the sum of the maximum horizontal component and the minimum horizontal component, STEP 78 "Net Horiz. Comp. = MAX Horiz. Comp. + MIN Horiz. Comp." The sum of the two components represents the result of the cancelling effect. That is, if the maximum horizontal component=0.5 and the minimum horizontal component=−1, then module $m_1$ only moves −0.5, (0.5+(−1)) in the "x" direction.

If, on the other hand, the result of inquiry 76 is that the product of the maximum and minimum horizontal components is greater than zero, then the net horizontal component is equal to the stronger of the maximum or minimum horizontal component, STEP 80 "Net Horiz. Comp.=Stronger Comp." As described previously, the stronger component is that component having a larger absolute value. In one example, the stronger component represents the fact that one component subsumes the other component. For instance, if the maximum horizontal component=4 and the minimum horizontal component=2, then module $m_1$ moves 4 in the "x" direction.

In addition to determining the net horizontal component, a net vertical component is also calculated. Similar to calculating the net horizontal component, first it is determined whether the product of the maximum and minimum vertical components is less than or equal to zero, INQUIRY 82, "Is MAX Vert×MIN Vert≦0?" If the product is less than zero, then the net vertical component is equal to the sum of the maximum and minimum vertical components, STEP 84 "Net Vert. Comp.=MAX Vert. Comp.+MIN Vert. Comp." On the other hand, if the product is greater than zero, then the net vertical component is equal to the stronger of the maximum and minimum vertical components, STEP 86 "Net Vert. Comp.=Stronger Comp." In the above example, since the maximum and minimum vertical components are equal to zero, the product of the two components is zero, and thus, the net vertical component is equal to zero, which is the sum of the two components. The net horizontal and net vertical components represent the net force ($net_1(F_x,F_y)$) that acts upon the overlapping module, e.g., module $m_1$.

Returning to FIG. 3, in one embodiment, after the net repelling force for each overlapping module in a floor plan is computed, then either a move operation or a reshape operation is performed, STEP 38 "Move/Reshape." As used herein, a move operation generally consists of moving each overlapping module (except preplaced or guardian modules) a specified direction and distance, which is based on the module's respective net repelling force.

A reshape operation generally consists of altering the aspect ratio of each flexible shaped overlapping module, wherein the amount each ratio is altered is based upon the respective module's net repelling force. The move and reshape operations are described in detail further below with reference to FIGS. 7a and 7b.

In the preferred embodiment, in order to preserve the initial shape of as many modules as possible, the number of reshape operations is minimized by performing a number of move operations before performing a reshape operation. This procedure is explained in detail below, however, in general, a group of move operations is performed and after each move operation in the group, a determination is made as to the best floor plan in the group. If it is shown that the group of move operations further reduces the amount of overlap in the floor plan, then another group of moves is performed. However, if the amount of overlap has not been reduced, then a reshape operation is performed.

Figure 7A:
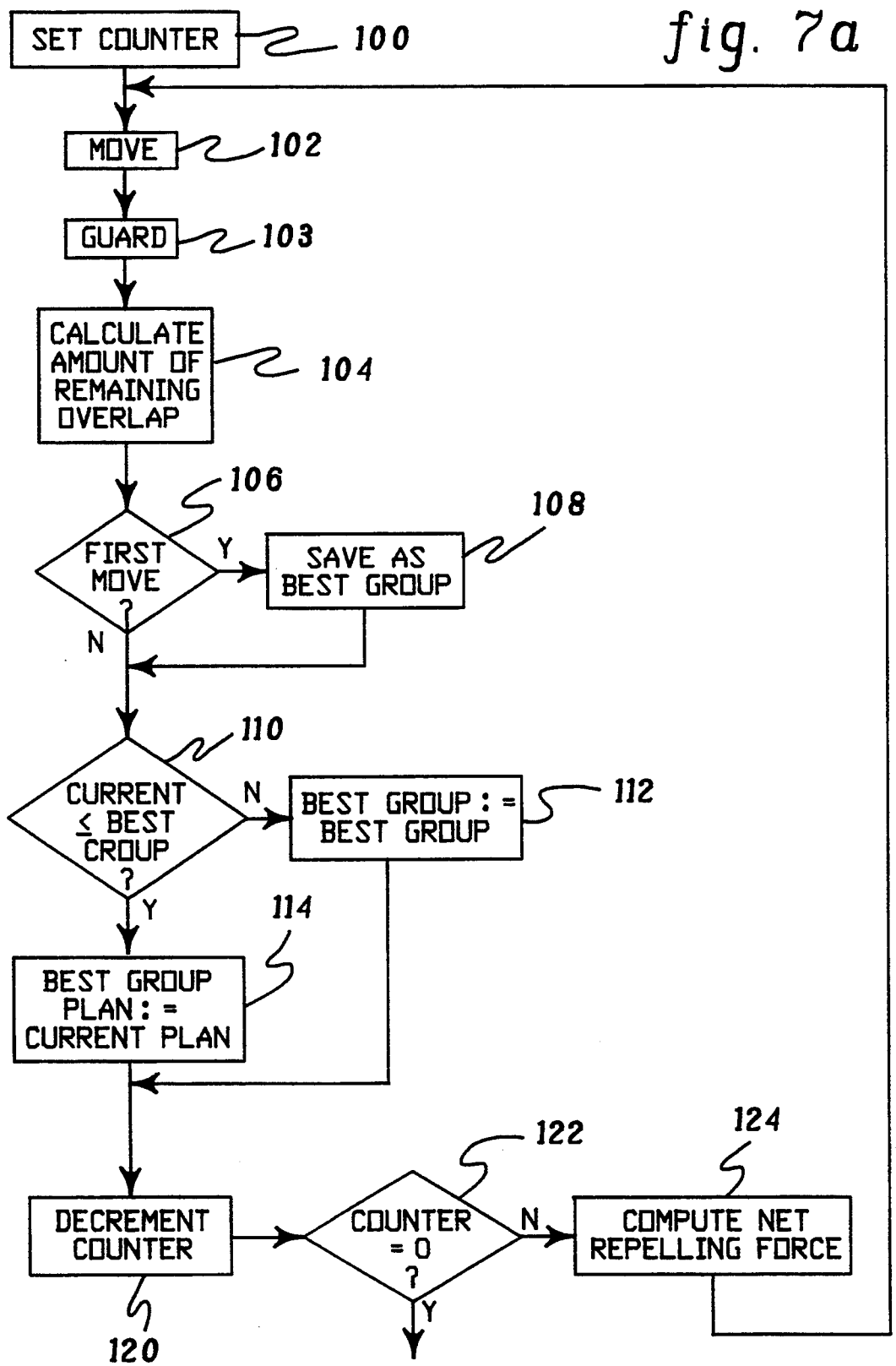
FIGS. 7a and 7b illustrate a block diagram of one embodiment of the processing steps for moving and/or reshaping a module, in accordance with the principles of the present invention.

Referring to FIG. 7a, in one example, a group of move operations consists of five move operations, and thus, a counter is set to five, STEP 100 "Set Counter." It will be apparent to those of ordinary skill in the art, however, that any number of move operations may be included in a group of move operations and that the number five is merely one selection. It will also be apparent that while in one embodiment, a series of move operations is performed before a reshape operation, the invention is not limited to performing the operations in this order.

Subsequent to setting the counter, a move operation is performed wherein each overlapping module within the floor plan is moved based on its computed net repelling force,. STEP 102 "Move." (It is understood that the modules "moving" are only those modules capable of "moving". That is, the preplaced and guardian modules are not being "moved". Further, moving refers to the relocating of the planned positions of the overlapping modules in the current floor plan so that the floor plan becomes updated and a new floor plan results.) In particular, each overlapping module is moved horizontally in a direction and a distance equal to the value of the net horizontal component of the net repelling force and vertically in a direction and a distance equal to the value of the net vertical component of the net repelling force. For example, if the net repelling force for a particular module is (2,−1), then that module is moved along the positive x axis a distance of 2 and along the negative y axis a distance of 1.

After completing the move operation on the current floor plan, in one embodiment, a guard operation is performed, STEP 103 "Guard." During this operation, any module overlapping a preplaced or guardian module is moved using the method described above. However, since a preplaced or guardian module cannot move, the repelling force used to remove the overlapping module is full strength. That is, the force is not divided in half.

Subsequent to performing the move and guard operations, in one embodiment, the sum of the remaining overlap areas is calculated, STEP 104, "Calculate Amount of Remaining Overlap." Then, if this is the first move operation in the group, INQUIRY 106 "First Move?" a copy of this floor plan is saved as the best group plan, STEP 108 "Save As Best Group" and flow passes to STEP 110 (described below). The best group plan is saved in order to ensure that the reshape operation is performed on the floor plan having the least amount of total overlap area.

Returning to INQUIRY 106, if this was not the first move operation within the group of move operations, then a comparison of the total amount of overlapping area within the current plan is compared to the total amount of overlapping area in the best group plan, INQUIRY 110 "Current≦Best Group?" Should the current floor plan have more overlapping area than the best group plan, then the best group floor plan remains the best, STEP 112 "Best Group:=Best Group." If, on the other hand, the current floor plan has less overlapping area, then the current plan becomes the best group plan, STEP 114 "Best Group Plan:=Current Plan."

Subsequently, the counter is decremented, STEP 120 "Decrement Counter," so that the number of move operations does not exceed the limit set, e.g., five. It will be apparent to those of ordinary skill in the art that this step, as well as some of the other steps, may be performed in an alternate sequence, and that this block diagram merely depicts one example.

Figure 7B:
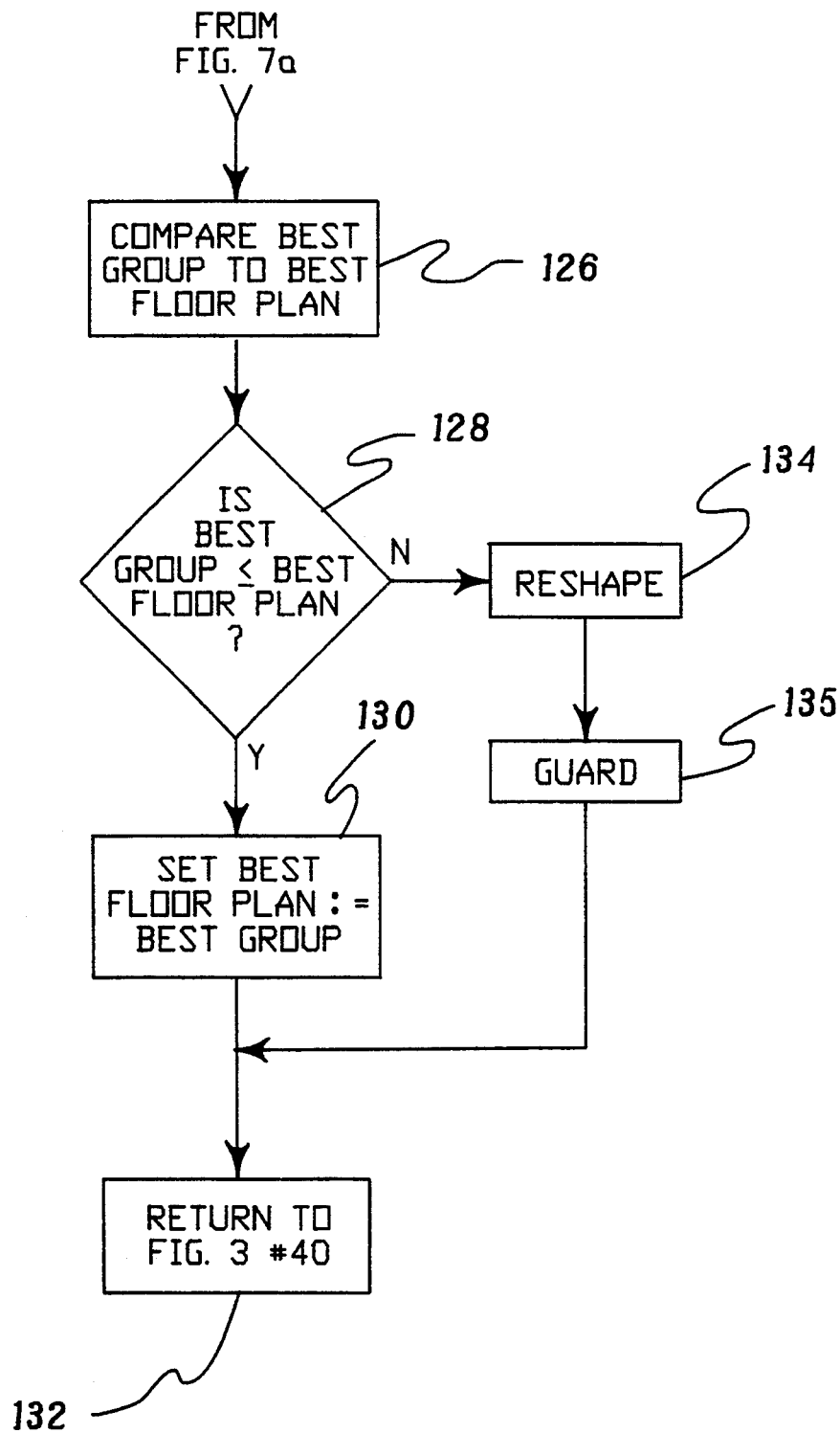

Subsequent to decrementing the counter, a determination is made as to whether the counter is exhausted, INQUIRY 122 "Counter=0?" If the value of the counter is not equal to zero, then the net repelling force for each remaining overlap is calculated as described above, STEP 124 "Compute Net Repelling Force," and thereafter, the flow returns to STEP 102 "MOVE." However, should the selected number of move operations be complete and therefore, the counter is zero, the best group floor plan is compared to the overall best floor plan, which is initially set equal to the initial floor plan, STEP 126 "Compare Best Group to Best Floor Plan" (FIG. 7b).

Assuming the plan resulting from the group of move operations has the same amount or less overlap area than the best floor plan found thus far, INQUIRY 128 "Is Best Group≦Best Floor Plan?", then the best floor plan is set equal to the best group plan, STEP 130 "Set Best Floor Plan:=Best Group" and flow returns to STEP 40 of FIG. 3, STEP 132 "Return to FIG. 3, #40." If, on the other hand, the best group plan has more overlap area than the best floor plan, it is assumed that the move operations are no longer working and, thus a reshape operation is performed on the best floor plan found thus far, STEP 134 "Reshape."

As previously stated, a reshape operation is only performed on flexible shaped modules. A reshape operation may alter the aspect ratio of each overlapping module while maintaining substantially the same amount of area thereby causing a module to become wider and shorter or narrower and taller. In order to reshape each module, its respective net force is applied in one direction. Thus, one of the components of the force (horizontal or vertical) is set to zero. The zero component is that component which is the weakest, i.e., having the smallest absolute value. The weakest component is set to zero and the other component, i.e., the stronger component is used to reshape the respective module (these components are referred to as the reshape force). For example, if a module $m_1$ has a net force of $(-2,1)$, then the stronger component is the horizontal component, since the absolute value of $-2$ is greater than the absolute value of 1, and the other component is set to zero. If the absolute value of the net force components are equal, then one of the components is chosen at random.

After the reshape force is determined, it is used to alter the aspect ratio. This is accomplished by first determining a reference point which is, for instance, the center point of a given module and then subtracting the value of the stronger component from the reference point thereby establishing a new center point. For instance, in the above example, the stronger component is the horizontal component, and thus, $-2$ is subtracted from the reference point of module $m_1$. This causes module $m_1$ to become wider and shorter.

After the aspect ratio of the module is altered, a determination is made as to whether the new ratio is within the predefined constraints set on the aspect ratio for a particular module. When the constraints are violated, the reshape force is recomputed so that it is as close to the original computed force as possible while satisfying the constraints. This new reshape force is then used to reshape the given module.

After the reshape operation is complete, another guard operation is performed, STEP 135 "Guard." As described above, the guard operation protects the preplaced and guardian modules. Therefore, if a module is overlapping either a preplaced or guardian module, then its full force is used to reshape the overlapping module and eliminate the overlap. Subsequent to the guard operation, flow returns to STEP 40 (FIG. 3), STEP 132 "Return to FIG. 3, #40."

Referring again to FIG. 3, after the iterative step of minimizing overlaps is complete, the threshold count is decremented, STEP 40 "Decrement Threshold Count," and then an inquiry is made as to whether the threshold count is exhausted, INQUIRY 42 "Is Threshold Count=0?" If the threshold count is not equal to zero, then flow returns to INQUIRY 33 "Is Plan Legal?" and the process of minimizing overlaps continues, if necessary. Otherwise, if the threshold count is exhausted, then an inquiry is made as to whether the resultant plan from the desired number of minimizing overlaps is legal, INQUIRY 43 "Is Plan Legal?" Once again, if it is legal, then processing ceases, STEP 48 "Final Plan." However, if the plan is not legal then a fitting technique is used to eliminate the remaining overlaps (fitting is described in detail below).

After the minimizing of overlaps step has been performed the desired number of iterations, the resulting floor plan is still valid, i.e., all the modules satisfy the given bounds on aspect ratios, satisfy the area requirement and fit within the predefined area. However, the floor plan is not legal because there are remaining overlaps. At this point, it is assumed that the remaining overlaps have been spread across the modules and that pieces of unused space are available in the plan. It is further assumed that if a piece of unused space is found next to an overlapping module, then the space cannot be used in connection with moving or reshaping the overlapping module. This is true since, if the space could have been used during moving or reshaping, it would have been used. The unused space can be treated, however, as gravitational media (described below), if it is located between a pair of modules. In addition, each of the modules within the pair generates an attracting force (also described below) which acts through the gravitational media. As described further below, attracting forces and gravitational media are used during the fitting step to eliminate the remaining overlaps. (Once again, the term "force" is not being used in its conventional sense. The term "attracting force" is a convenient way of determining and quantifying the manner in which unused space is given to an overlapping module.)

Figure 8:
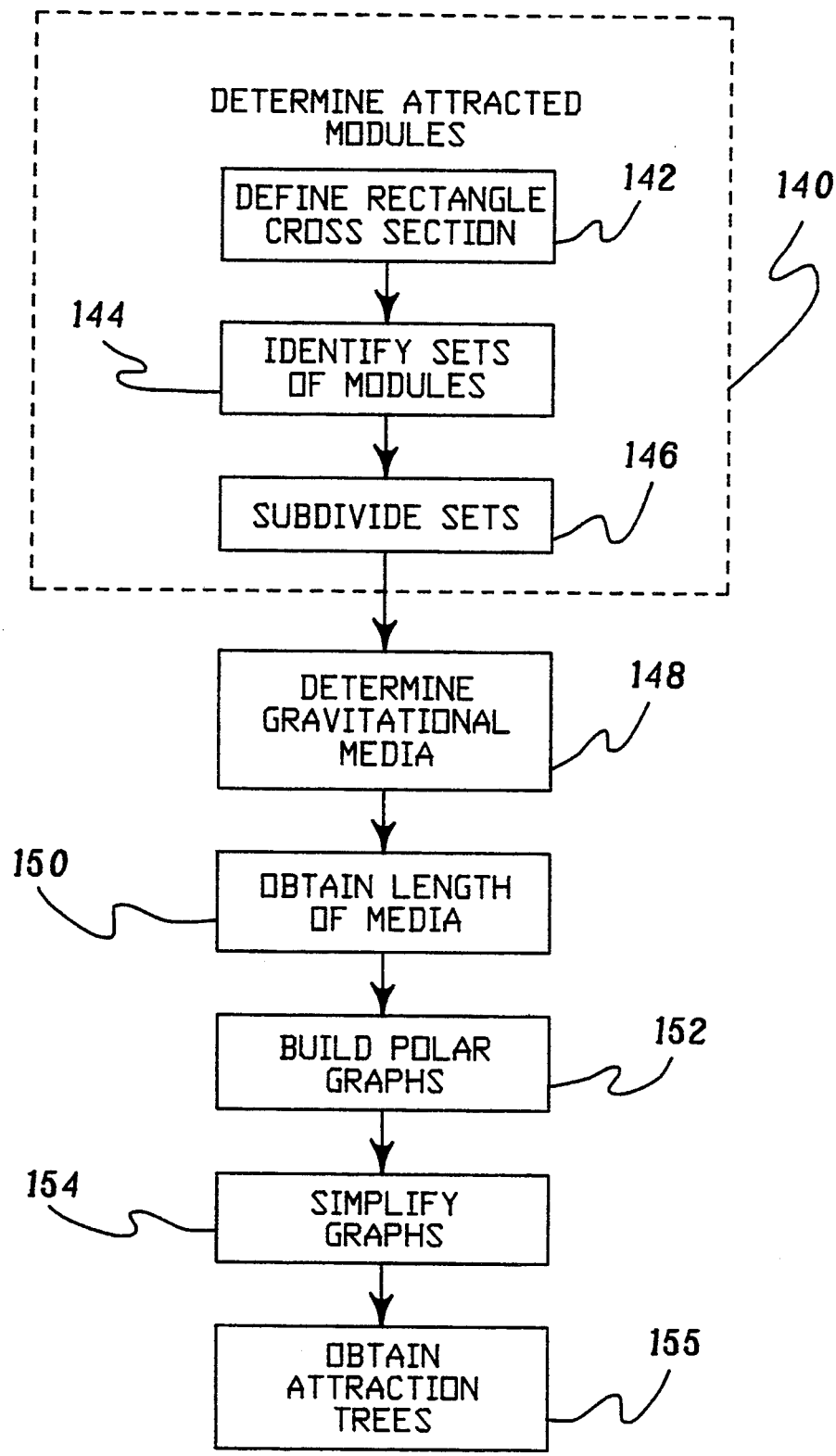
FIG. 8 illustrates a block diagram of one embodiment of the processing steps for computing the attracting forces, in accordance with the principles of the present invention.

As depicted in FIG. 3, in one embodiment, the step to be performed after INQUIRY 43, is calculating the attracting forces to be used during fitting of the flexible shaped modules, STEP 44 "Calculate Attracting Forces." The main processes involved in computing the attracting forces are depicted in FIG. 8.

Figure 9A:
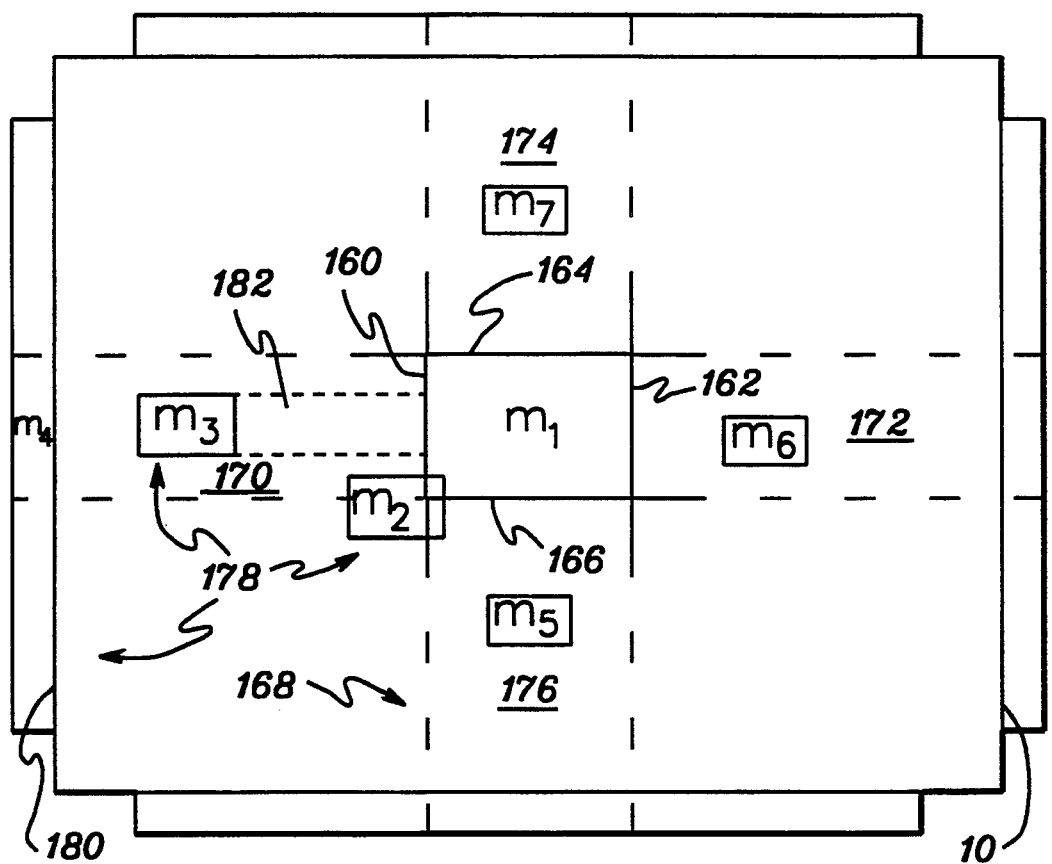
FIG. 9a depicts a rectangle cross section of an overlapping module in accordance with the principles of the present invention.

In one embodiment, one of the first steps involved in computing the attracting forces is determining which modules are attracted to a given overlapping module, STEP 140 "Determine Attracted Modules." To obtain the attracted modules, a rectangle cross section for each overlapping module is defined, STEP 142 "Define Rectangle Cross Section" (FIG. 8) by extending the edges of each overlapping module, e.g. $m_1$, parallel to the boundaries of predefined area 10, (see FIG. 9a). That is, for instance, the left edge of $m_1$ (Reference Number 160) and the right edge of $m_1$ (Reference Number 162) are extended vertically to the top and bottom of area 10. Similarly, the upper edge 164 and lower edge 166 of $m_1$ are extended horizontally to the left and right sides of area 10. By subdividing area 10 in this manner, a rectangle cross section 168 is created for $m_1$ wherein the cross section includes four regions (170, 172, 174, 176) which are bounded by the extensions of the edges of $m_1$. The regions consist of, for example, a left region 170, a right region 172, a top region 174 and a bottom region 176, and each region contains a set of modules 178 which are partially or wholly within the region, STEP 144 "Identify Sets of Modules." In one embodiment, there is always one module within each set since each region has a guardian module 180.

Each set of modules is partitioned into two disjoint sets, STEP 146 "Subdivide Sets": an overlapping set which contains only those modules (e.g., $m_2$) within a region that partially or wholly overlap module $m_1$ and a distant set which contains those modules (e.g., $m_3$, $m_4$) within the same region that do not overlap $m_1$. For example, referring to FIG. 9a, left region 170 of $m_1$ contains a set of modules. The set is partitioned into an overlapping set containing module $m_2$ and a distant set containing modules $m_3$ and $m_4$.

The set of distant modules represents the modules which are attracted to $m_1$. Therefore, $m_1$ attracts $m_3$ and $m_4$, since $m_3$ and $m_4$ are elements of the set of distant modules in the left region. Stated in more general terms:

$m_i$ attracts $m_j$ if $m_j \epsilon$ distantModules($m_i \cdot R_{region}$)

where:
$m_i$ is the given overlapping module; and
$m_j$ represents those modules which are elements ($\epsilon$) of the set of distant modules (distantModules) for a given region with respect to $m_i$ ($m_i \cdot R_{region}$, where region is assigned left, right, top or bottom).

Figure 9B:
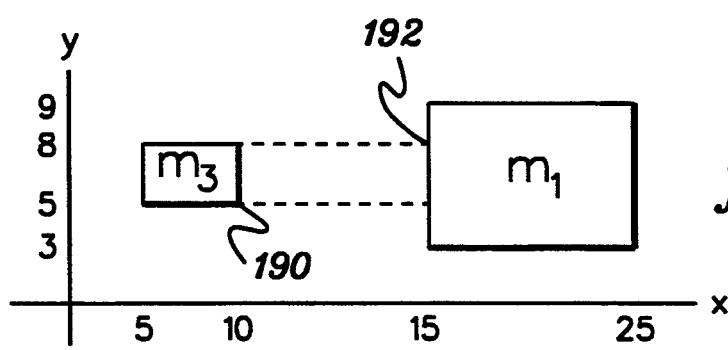
FIGS. 9b–9e illustrate the corner and origin points for modules in each of the regions created in accordance with the principles of the present invention.

When $m_i$ attracts $m_j$, it is along a gravitational medium$_{i,j}$ ($m_i$ attracts $m_j$ along medium$_{i,j}$), STEP 148 "Determine Gravitational Media" (FIG. 8). As one example, when $m_1$ attracts $m_3$ it is along medium$_{1,3}$ (see Reference Number 182 in FIG. 9a), where medium$_{1,3}$ (or, in general, medium$_{i,j}$) represents the rectangle enclosing the space separating $m_1$ (or $m_i$) from $m_3$ (or $m_j$). The origin and corner points of the gravitational media located in each region are determined using the following criteria:

(1) for each distant module $m_j$ of overlapping module $m_i$ within the left region (i.e., for $m_j \epsilon$ distantModules($m_i \cdot R_{left}$)):
  (a) the origin of medium$_{i,j}$ is at a point which has an x coordinate equal to the right edge of module $m_j$ and a y coordinate equal to the greater value of the bottom of $m_i$ or the bottom of $m_j$ (i.e., origin(medium$_{i,j}$):= right($m_j$) @ max(bottom($m_i$),bottom($m_j$))). For example, referring to FIG. 9b, the origin of medium$_{1,3}$ is located at reference numeral 190. The coordinate of the point represented by reference numeral 190 is (10,5); and
  (b) the corner of medium$_{i,j}$ is at a point which has an x coordinate equal to the left edge of module $m_j$ and a y coordinate equal to the lesser value of the top of $m_i$ or the top of $m_i$ (i.e., corner(medium$_{i,j}$):=left($m_i$) @ min(top($m_i$),top($m_j$))). In the example in FIG. 9b, the corner is located at reference numeral 192 at coordinates (15,8).

Figure 9C:
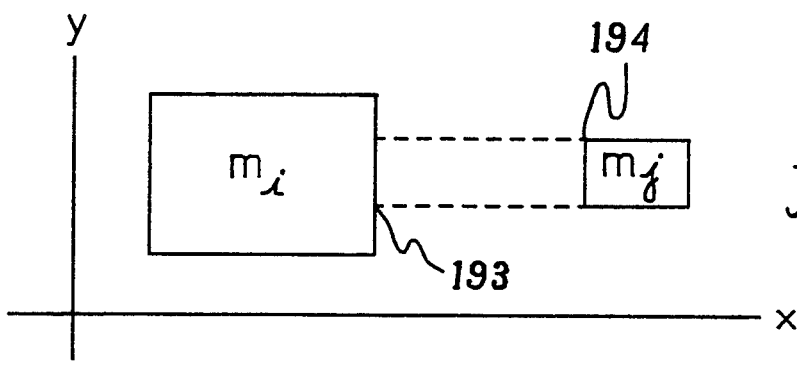

(2) Similarly, for $m_j \epsilon$ distantModules ($m_i \cdot R_{right}$):
  (a) the origin of medium$_{i,j}$ is at a point which has an x coordinate equal to the right edge of module $m_j$ and a y coordinate equal to the greater value of the bottom of $m_i$ or the bottom of $m_j$ (see Reference Number 193 FIG. 9c) (i.e., origin(medium$_{i,j}$):==right($m_i$) @ max (bottom($m_i$),bottom($m_j$))); and
  (b) the corner of medium$_{i,j}$ is at a point which has an x coordinate equal to the left edge of $m_j$ and a y coordinate equal to the lesser value of the top of $m_i$ or the top of $m_j$ (see Reference Number 194 FIG. 9c) (i.e., corner(medium$_{i,j}$):=left($m_j$) @ min (top($m_i$, top($m_j$))).

Figure 9D:
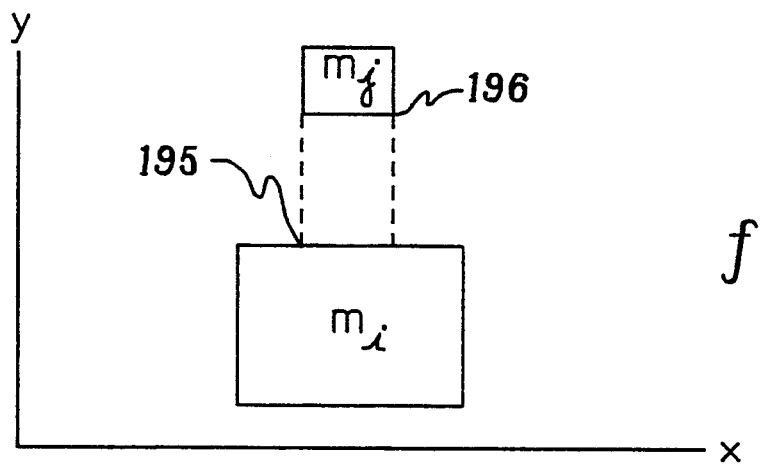

(3) For each distant module $m_j$ of overlapping module $m_i$ within the top region (i.e., for $m_j \epsilon$ distantModules($m_i \cdot R_{Top}$)):
  (a) the origin of medium$_{i,j}$ is at a point which has an x coordinate equal to the greater of the left edge of $m_i$ or the left edge of $m_j$ and a y coordinate equal to the top edge of $m_i$ (see Reference Number 195 in FIG. 9d) (i.e., origin(medium$_{i,j}$):=max(left($m_i$), left($m_j$)) @ top($m_i$))); and
  (b) the corner of medium$_{i,j}$ is at a point which has an x coordinate equal to the lesser of the right edge of $m_i$ or the right edge of $m_j$ and a y coordinate equal to the bottom edge of $m_j$ (see Reference Number 196 in FIG. 9d) (i.e., corner(mediums$_{i,j}$):=min(right($m_i$), right($m_j$)) @ bottom($m_j$))).

Figure 9E:
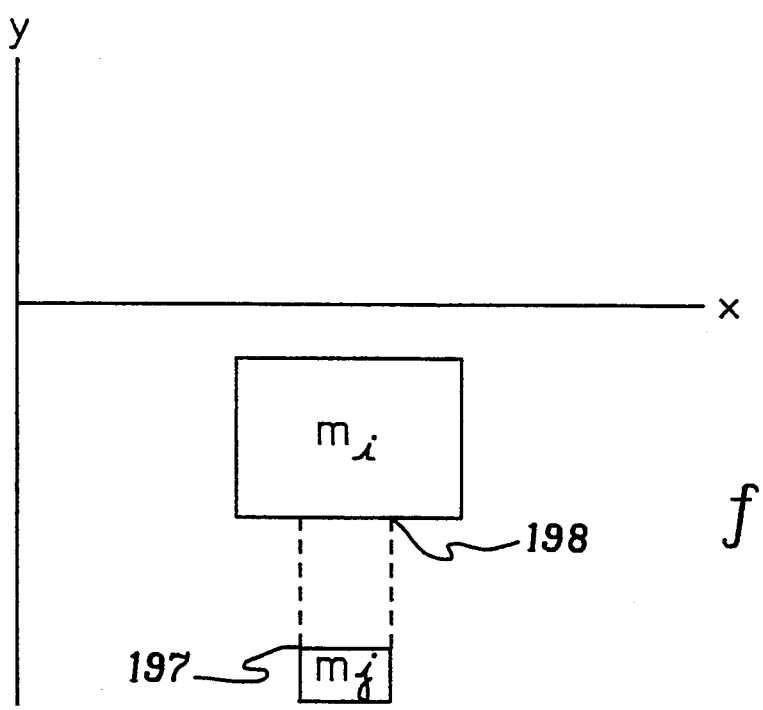

(4) For each distant module $m_j$ of overlapping module $m_i$ within the bottom region (i.e., for $m_j \epsilon$ distantModules ($m_i \cdot R_{Bottom}$)):
  (a) the origin of medium$_{i,j}$ is at a point which has an x coordinate equal to the greater of the left edge of $m_i$ or the left edge of $m_j$ and a y coordinate equal to the top edge of $m_j$ (see Reference Number 197 in FIG. 9e) (i.e., origin(mediums$_{i,j}$):=max(left($m_i$), left($m_j$)) @ top($m_j$))); and
  (b) the corner of mediums$_{i,j}$ is at a point which has an x coordinate equal to the lesser of the right edge of $m_i$ or the right edge of $m_j$ and a y coordinate equal to the bottom edge of $m_i$ (see Reference Number 198 in FIG. 9e) (i.e., corner(medium$_{i,j}$):=min(right($m_i$), right($m_j$)) @ bottom($m_i$))).

Subsequent to determining the origin and corner points of the gravitational media, the length of each medium is calculated, STEP 150 "Obtain Length of Media." The length of a medium located in either the left or right region is equal to the width of the medium, and the length of a medium in the top or bottom region is equal to its height. The length of a medium represents the distance separating two modules and thus, if two modules share a common edge, then the length of the corresponding medium is zero. Gravitational medium are directional in that the direction an attracting force is applied is dependent on whether the medium is in the horizontal or vertical direction with respect to a particular module. The lengths of the media in each region are used, for instance, to partially order the distant modules by length within the corresponding region. This is, if and only if (iff) the length of one medium in a region (e.g., from $m_i$ to $m_j$) is less than the length of another medium in that region (e.g., $m_i$ to $m_k$), then the following relationship exists $m_j \leq m_k$.

Stated another way:
$m_j \leq m_k$ iff length (medium$_{i,j}$) < length (medium$_{j,k}$). For example, if the left region has two mediums (medium$_{i,j}$ and medium$_{i,k}$) having lengths of 4 and 6, respectively, then since the length of medium$_{i,j}$ is less than the length of medium$_{i,k}$, $m_j \leq m_k$.

After the media for each overlapping module are ordered, the media, including their respective lengths and order, are used to construct a set of graphs for each overlapping module, STEP 152 "Build Polar Graphs." In one embodiment, the set of graphs for each overlapping module, referred to herein as polar graphs, include a graph for each region. For instance, for a given overlapping module $m_i$, four polar graphs are constructed in which the first represents the media corresponding to $m_i$ in the left region, the second represents the media in the right region, the third represents the media in the top region and the fourth represents the media in the bottom region corresponding to $m_i$.

Figure 10A:
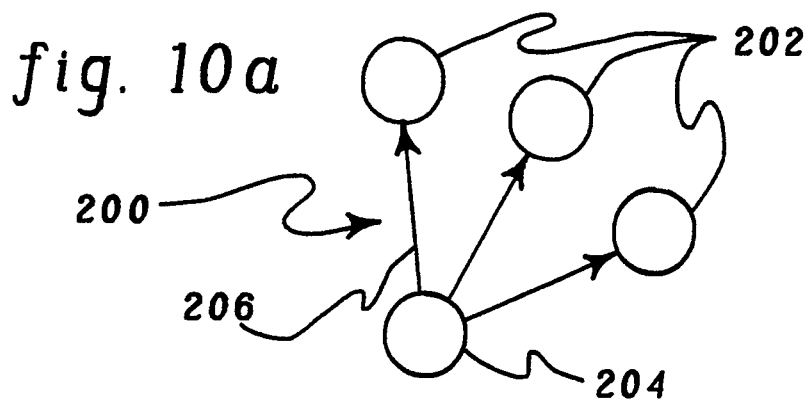
FIGS. 10a–10b represent examples of polar graphs constructed in accordance with the principles of the present invention.

As depicted in FIG. 10a, a polar graph 200 has a set of nodes 202 and a set of edges 206. Nodes 202 represent the distant and overlapped modules within a particular region corresponding to an overlapping module 204 and edges 206 represent the partially ordered ($\leqq$) relationship described above. Each edge is labelled with its respective medium and the length of the medium. An overlap module has a medium length of zero.

Figure 10B:
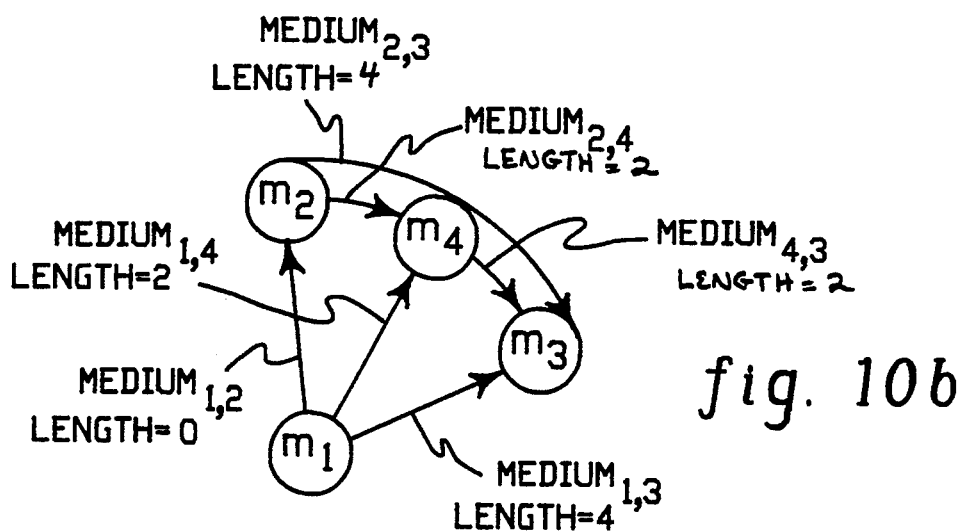

As an example, referring to FIG. 10b, $m_1$ is the overlapping module which is referred to as the source node; $m_2$ is the node corresponding to an overlapped module; and nodes $m_3$ and $m_4$ represent distant modules. Since $m_2$ is overlapped, its medium length is zero, and thus the node labelled $m_2$ is one of the first nodes in the graph. The length of the medium$_{1,3}$ is equal to, for example, 4 and the length of medium$_{1,4}$ is equal to, for example, 2. Since medium$_{1,4}$ is shorter than medium$_{1,3}$, the node corresponding to module $m_4$ is the next node in the graph and the last node in this example corresponds to module $m_3$. The edges from node $m_1$ to nodes $m_2$, $m_3$ and $m_4$ are each labelled with its corresponding medium and medium length. For instance, the edge from $m_1$ to $m_2$ is labelled medium$_{1,3}$ and its length equals 0. Similarly, the edge from $m_1$ to $m_4$ is labelled medium$_{1,4}$ and its length is equal to 2. Lastly, the edge from $m_1$ to $m_3$ is labelled medium$_{1,3}$ and its length is equal to 4.

In addition to the edges from $m_1$ to $m_2$, $m_3$ and $m_4$, each of the overlapped and distant modules may have one or more directed edges to another overlapped or distant module. The directed edge exists only if the following relation, as described previously, is satisfied:

$$m_j \leqq m_k \text{ iff length (medium }_{i,j}) < \text{length(medium}_{i,k})$$

Therefore, since medium$_{1,2}$ is less than medium$_{1,3}$ and medium$_{1,4}$ node $m_2$ has a directed edge to node $m_3$ and node $m_4$. The edge from node $m_2$ to node $m_3$ is labelled with its corresponding medium (i.e., medium$_{2,3}$) and its length which represents the distance from $m_2$ to $m_3$ (i.e. 4). Similarly, the other edges are defined and labelled.

Once constructed, each of the polar graphs for a given overlapping module represents the modules within a particular region. However, it is possible that a module may be partially or wholly blocked by another module and, therefore, the medium associated with the blocked module may be of limited or no use to the overlapping module. In order to determine which media are useful, each of the polar graphs are simplified, STEP 154 "Simplify Graphs," by using the processes depicted in FIG. 11.

Figure 12A:
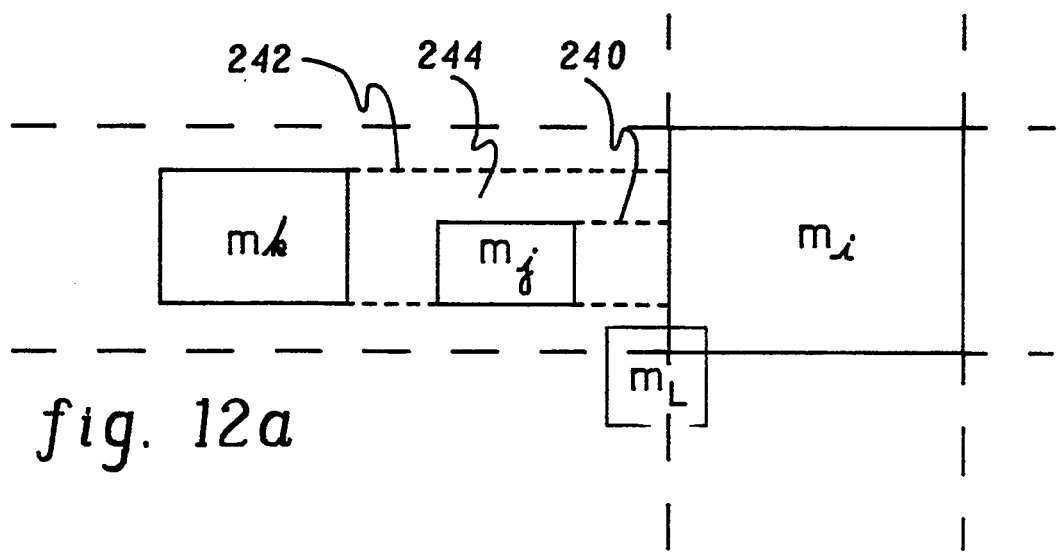
FIGS. 12a–12d illustrate various ways one module may block another module.

The simplifying process includes determining which modules are blocked and, therefore, have media of limited or no use, STEP 220 "Determine Blocked Modules." A module $m_k$ (see FIG. 12a) is considered blocked by module $m_j$ with respect to an overlapping module $m_i$ when the modules $m_j$ and $m_k$ are in the same region, the length of medium$_{i,j}$ is less than the length of medium$_{i,k}$ and medium$_{i,j}$ (See Reference Number 240) overlaps medium$_{i,k}$ (See Reference Number 242).

Figure 11:
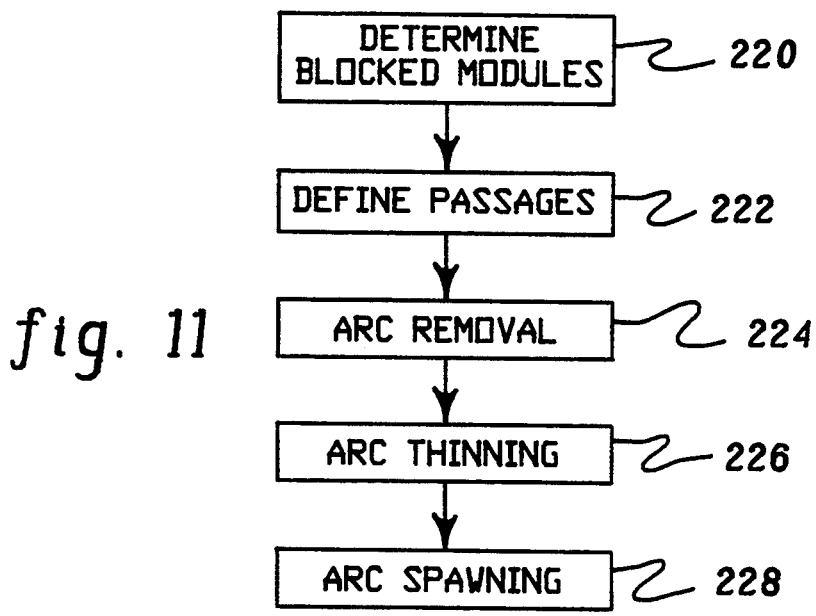
FIG. 11 illustrates a block diagram of one embodiment of the processes for simplifying the polar graphs, in accordance with the principles of the present invention.
Figure 12B:
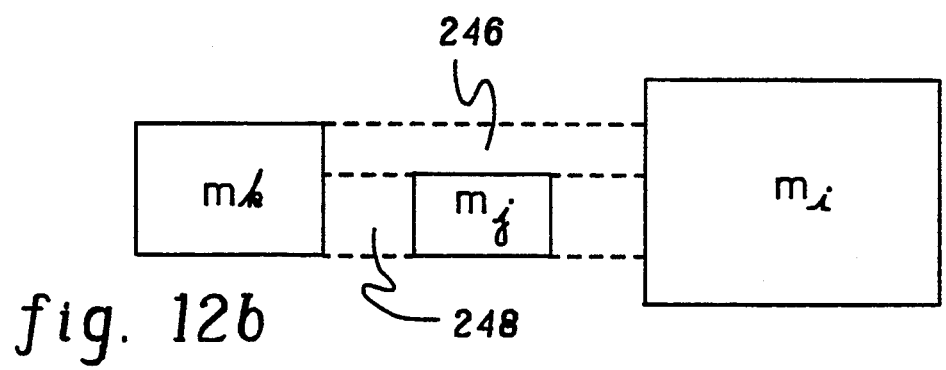

When medium$_{i,j}$ partially overlaps medium$_{i,k}$, then the non-overlapping areas of medium$_{i,k}$ (See Reference Number 244), referred to as "nonIntersections," is represented as a set of non-intersecting rectangles of medium$_{i,k}$ outside of medium$_{i,j}$. As depicted in FIG. 12b, a non-intersecting rectangle may be coupled to the source module $m_i$ (See Reference Number 246) or detached from it (See Reference Number 248). Each rectangle coupled to the source module is identified as a child gravitational medium (i.e., medium$_{i,k'}$ whereas the parent medium is medium$_{i,k}$) and may be used to define a passage to source module $m_i$, STEP 222 "Define Passages" (FIG. 11). In particular, the child medium (e.g., medium$_{i,k'}$) provides a passage to $m_i$ if and only if the length of medium$_{i,k'}$ is the same as the length of its parent's medium (medium$_{i,k}$). In one example, as illustrated in FIG. 12b, non-intersecting rectangle 246 is attached to module $m_i$, and thus, it is a child medium. In addition, since the length of the child medium is equal to the length of the parent medium, a passage is defined between $m_i$ and $m_k$. That is: $m_k$ is blocked by $m_j$ opening passages with respect to $m_i$, where passages=(medium$_{i,k'}$).

Subsequent to defining the passages in each region for a given module, each polar graph corresponding to the region is simplified, using the following three operations: arc removal, STEP 224 "arc removal," arc thinning, STEP 226 "arc thinning" and arc spawning, STEP 228 "arc spawning."

Figure 12C:
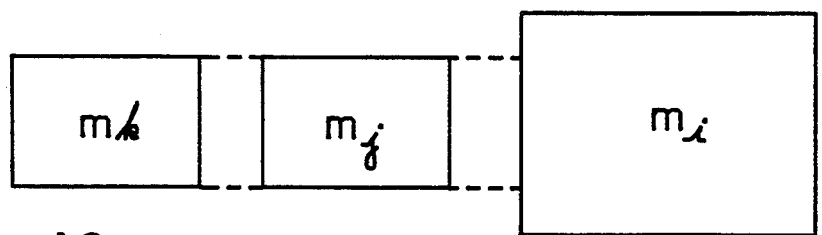

Arc removal removes from a polar graph any edge that represents a module which is blocked and thus, no passage exists to the overlapping module. For instance, as depicted in FIG. 12c, arc removal removes from the graph the edge from $m_i$ to $m_k$, since $m_j$ blocks $m_k$ in such a way that there is not an open passage from $m_i$ to $m_k$.

Arc thinning relabels the relevant edge in the graph to reflect the child medium (e.g., medium$_{i,k'}$), if, for example, $m_j$ blocks $m_k$ such that only one open passage exists, as is illustrated in FIG. 12b.

Figure 12D:
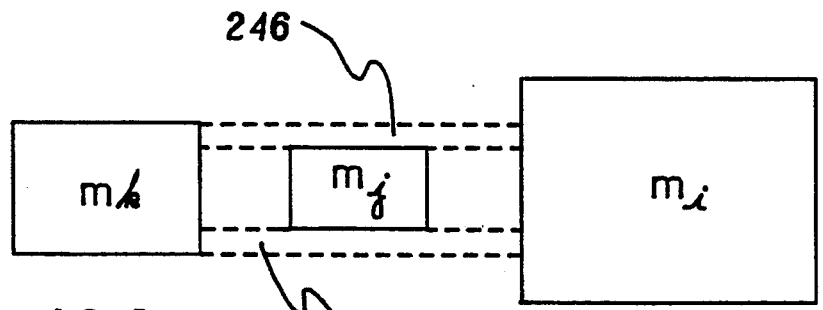

Arc spawning replaces in the graph the edge from, e.g., $m_i$ to $m_k$ with two edges if $m_j$ blocks $m_k$ in such a way that two open passages exists (See Reference Numbers 246, 250 in FIG. 12d).

After the process of simplifying the graphs is complete, the edges in the resulting graphs reflect the following:

(a) if the edge is from the source node to another node, e.g. $m_j$, then there is an open gravitational medium between the source node and $m_j$; and (b) if the edge is from a non-source node, e.g. $m_j$, to another non-source node, $m_k$, this means that the two nodes are related by the relation $\leqq$, which means that the length of the medium representing $m_j$ is less than the length of the medium representing $m_k$.

Referring back to FIG. 8, after the polar graphs are simplified, an attraction tree representing each simplified graph is constructed, STEP 155 "Obtain Attraction Trees." An example of an attraction tree 232 is depicted in FIG. 13. Attraction tree 232 has one or more leaves 234, which represent the open media for the source node, e.g. $m_1$. Thus, the leaves of the attraction tree represent those nodes that do not have a medium length of zero and can be directly reached from the overlapping or source module. The leaves include the medium and the medium's length. For instance, if after simplifying the polar graph depicted in FIG. 10b, nodes $m_4$ and $m_3$ are still available as open media, then these nodes are represented as leaves on attraction tree 232. Note that node $m_2$ is not a leaf, since it has a medium length of zero.

The open gravitational media are generally used, as described in detail below, to allow the source module to protrude into an open medium. In the preferred embodiment, however, only a minimum deviation is to be made to the present configuration of the overlapping module and, thus, the length of the open gravitational medium is limited such that it cannot go beyond a square shape. This is accomplished by reducing the height or width of the medium as follows:

(a) when the medium is in the left or right region and the height is less than the width, then the width is reduced to equal the height, thus producing a square shape; and (b) when the medium is in the top or bottom region and the height is greater than the width, then the height is reduced to equal the width, thereby producing a square shape.

The new width or height of each gravitational medium replaces the width or height of the corresponding medium in the relevant attraction tree.

Returning to FIG. 3, at this point the attracting forces have been calculated, STEP 44, which includes determining the attracted modules and the gravitational media, building and simplifying the polar graphs and obtaining the attraction trees, thus in one embodiment, the next step is to fit (which is described in detail below with reference to FIG. 14) the modules into the predefined area such that no overlaps exist, STEP 45 "Fitting."

In general, during the fitting step an overlapping module is fit into the plan by indenting and/or protruding. Indenting is the awarding of an overlapArea to the overlapping module, and protruding is the awarding of space adjacent to an overlapping module to the overlapping module in order to increase the area of that module. When indenting occurs, a rectangular area is removed from the overlapped module and awarded to the overlapping module, and when protruding occurs a rectangular area is appended to the overlapping module.

In particular, referring to FIG. 14, one step performed during fitting is determining a set of overlap areas (referred to as indentations$_i$) between the overlapping module ($m_i$) and all the modules it overlaps (all $m_j$), STEP 240 "Identify Indentations." For example, if module $m_i$ overlaps two modules, then indentations$_i$ contains two overlapping areas. Initially, all the overlap areas are "unmarked," i.e., no one module has acquired that area. Once a module, such as $m_i$ (where $m_i$ overlaps $m_j$ giving overlap$_{i,j}$) is awarded the overlap area, then overlap$_{i,j}$ is considered "marked in" for $m_i$. Therefore, this overlap area (or space) cannot be awarded to $m_j$, and it is considered "marked out" for $m_j$.

In addition to identifying the indentations for a module, any protrusions are also identified, STEP 242 "Identify Protrusions." The protrusions of a module, such as $m_i$, represent the leaves of the attraction trees for $m_i$. In other words, protrusions$_i$ is a set of all the open gravitational media for $m_i$. Initially, each medium within the set is available, and thus, it is "unmarked." Once the medium is acquired, then it is "marked in," as described in detail below.

Subsequent to identifying the indentations and protrusions for a module, a determination is made as to whether a module requires space and therefore, is needy. A module requires space if:

currentArea($m_i$) < area($m_i$), wherein:

(a) area($m_i$) refers to the minimum area requirement of module $m_i$; and (b) currentArea($m_i$):=area($m_i$)−sumI$_i$+sumP$_i$ wherein:

(1) sumI$_i$ represents the sum of all the overlap areas in $m_i$ which are not "marked in"; and (2) sumP$_i$ represents the sum of all the "marked in" areas of gravitational media of $m_i$.

If a module is needy, then the amount of space that a module needs (referred to herein as neediness) to eliminate one or more overlaps by either indenting or protruding is computed, STEP 244 "Compute Neediness."

Neediness is computed using the following formula:

$$\text{Neediness}_i = \frac{\text{area}(m_i) - \text{currentArea}(m_i)}{\text{SumUnmarkedP}_i}$$

wherein:

SumUnmarkedP$_i$ is the total amount of unmarked gravitational media of $m_i$.

After neediness is computed for each overlapping module, the set of needy modules is ordered such that the most needy modules are first. Next, the most needy module, e.g. $m_i$, is awarded all of its unmarked overlap areas from indentations$_i$, STEP 246 "Award Indentations." When an overlap area is awarded to $m_i$ (i.e., indenting has occurred), the awarded overlap$_{i,j}$ is "marked in" for $m_i$ and it is "marked out" for $m_j$.

Should module $m_i$ still be needy after it is awarded all its unmarked overlap area, then $m_i$ is awarded one or more protrusions, STEP 248 "Award Protrusions." The steps involved with awarding protrusions are depicted in FIG. 15.

Referring to FIG. 15, in one embodiment, the largest unmarked medium available in protrusions$_i$ is selected and it is determined how much of that medium is needed by module $m_i$, STEP 252 "Select Largest Medium." Subsequent to determining the needed amount of the medium, a process, referred to herein as marking in (STEP 254) is performed. During this process, an inquiry is made as to whether the needed portion of a medium overlaps with any member of a set, named markedInProtrusions, which denotes the set of all "marked in" gravitational media, INQUIRY 256 "Intersects with Marked Medium?" Should a member within the set overlap the needed portion of a medium, then the corresponding open passages for the needed portion of the medium are computed as described previously, STEP 258 "Determine Non-Intersecting Area." The needed open passages are added to markedInProtrusions, STEP 260 "Add to marked-InProtrusions" and awarded to the overlapping module (i.e., protruding takes place), STEP 262 "Award Space." When this is accomplished, the medium is considered "marked in" to module $m_i$.

On the other hand, when a member of the set does not overlap the medium, INQUIRY 256 "Intersects with Marked Medium?" then the medium is added to the set markedInProtrusions, STEP 260 "Add to MarkedInProtrusions" and the available space is awarded to the overlapping module (i.e., protruding takes place), STEP 262 "Award Space." After this process is complete, STEP 248 "Award Protrusions" (FIG. 14) is complete.

Subsequently, the needy module is deleted from the set of needy modules and an inquiry is made as to whether there are remaining needy modules, STEP 250 "More Needy Modules" (FIG. 14). Should there be more modules that need space, then flow returns to STEP 244 "Compute Neediness" and processing continues. Otherwise, the fitting process is complete, and thus, there are no remaining overlaps.

Returning to FIG. 3, after the fitting process is finished, an inquiry is made as to whether the plan is satisfactory, INQUIRY 46 "Is Plan Satisfactory?" That is, do all the modules satisfy their respective minimum area requirements. If the plan is satisfactory, then the resulting plan is the final plan, STEP 48 "FINAL PLAN" and processing ceases.

Otherwise, if the resulting floor plan is unsatisfactory, then there is an option to relax some of the constraints, such as, for instance, the module's aspect ratio, and to repeat the entire process by returning to STEP 32 "Set Threshold Count."

A floor planning technique for providing a non-rectangular floor plan has been described in detail herein. The technique begins with an initial valid floor plan having a predefined area and overlapping modules and produces therefrom a final floor plan having the same predefined area and no overlapping modules. The floor planning technique of the present invention may be used in a variety of situations including, but not limited to, architectural floor planning, computer chip design and any other situations in which a plurality of modules need to be placed within a predefined area.

In one example, the technique has been used to produce a layout for a computer chip. The technique has been implemented as an interactive design system in the Smalltalk/PROLOG integrated environment. As described previously, in this environment, Smalltalk and PROLOG cooperate as a client and a server, respectively. Smalltalk can request PROLOG to prove a goal in a given context, and PROLOG can ask Smalltalk to create objects and to call methods to prove the goal.

Smalltalk's object orientated programming was combined with PROLOG's logic programming paradigms such that each preserves its own paradigm. On the Smalltalk side, a class that represents PROLOG and a set of related methods have been added to capture requests to PROLOG. On the PROLOG side, as described previously, three predicates have been defined which facilitate message passing to and from Smalltalk. The three predicates are "create" for instance creation, "assign" for instance variable assignment and "query" for Smalltalk method invocation.

In one example, a smalltalk class, referred to as "Module", defines the spatial constraints of the VLSI modules in the chip layout along with their behavior. The constraints are described by a collection of "Instance Variables" for the class and the behavior is described by "Methods." Similarly, a Smalltalk class, referred to as "Chip," defines the topological constraints of the VLSI chip along with its behavior.

The system starts by creating instances of "Module" for the modules in the layout and assigning initial values to the objects "Instance Variables." An instance of "Chip" is also created for the chip. Once instances or objects have been created, they communicate to each other passing messages to and from each other. For instance, "Module" objects send a message "computeOverlap" to each other to compute overlaps, if they overlap. As an instance of "Module" computes the amount of overlaps with respect to others, it sends itself a message "computeNetForce" which computes the corresponding net force based on the overlaps, as was discussed previously herein. As the overlaps have been computed and a net force obtained, PROLOG is asked to make a control decision whether to move, to reshape, or to finalize a plan using attracting forces. Smalltalk objects then send themselves the corresponding message and act accordingly. Afterwards, the process repeats until a final plan is produced.

Figure 16:
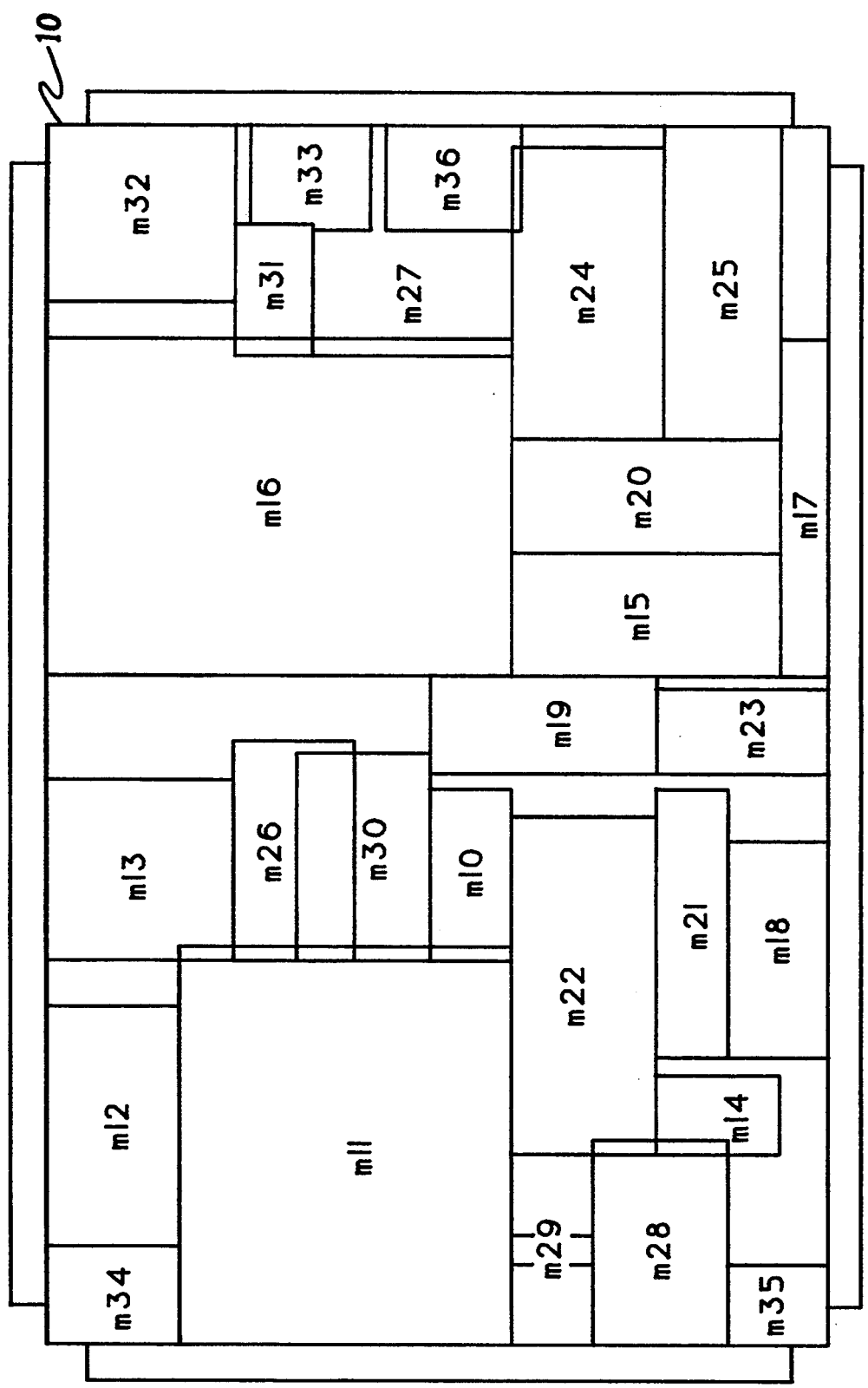
FIG. 16 depicts one example of an initial chip layout used to produce a final legal layout, in accordance with the principles of the present invention.

The following example is based upon the floor planning technique of the present invention and the interactive design system, as described above. Referring to FIG. 16, an initial layout having a predefined area with dimensions of 80,000 by 80,000 is used to produce a final legal floor plan. In this example, the initial layout is of a VLSI chip. The chip is 95.3 percent full and modules $m_{32}$, $m_{33}$, $m_{34}$, $m_{35}$ and $m_{36}$ are preplaced and the remaining modules are flexible shaped modules. Most of the modules are defined with a range on their aspect ratios from 0.5 to 2.5.

Figure 17:
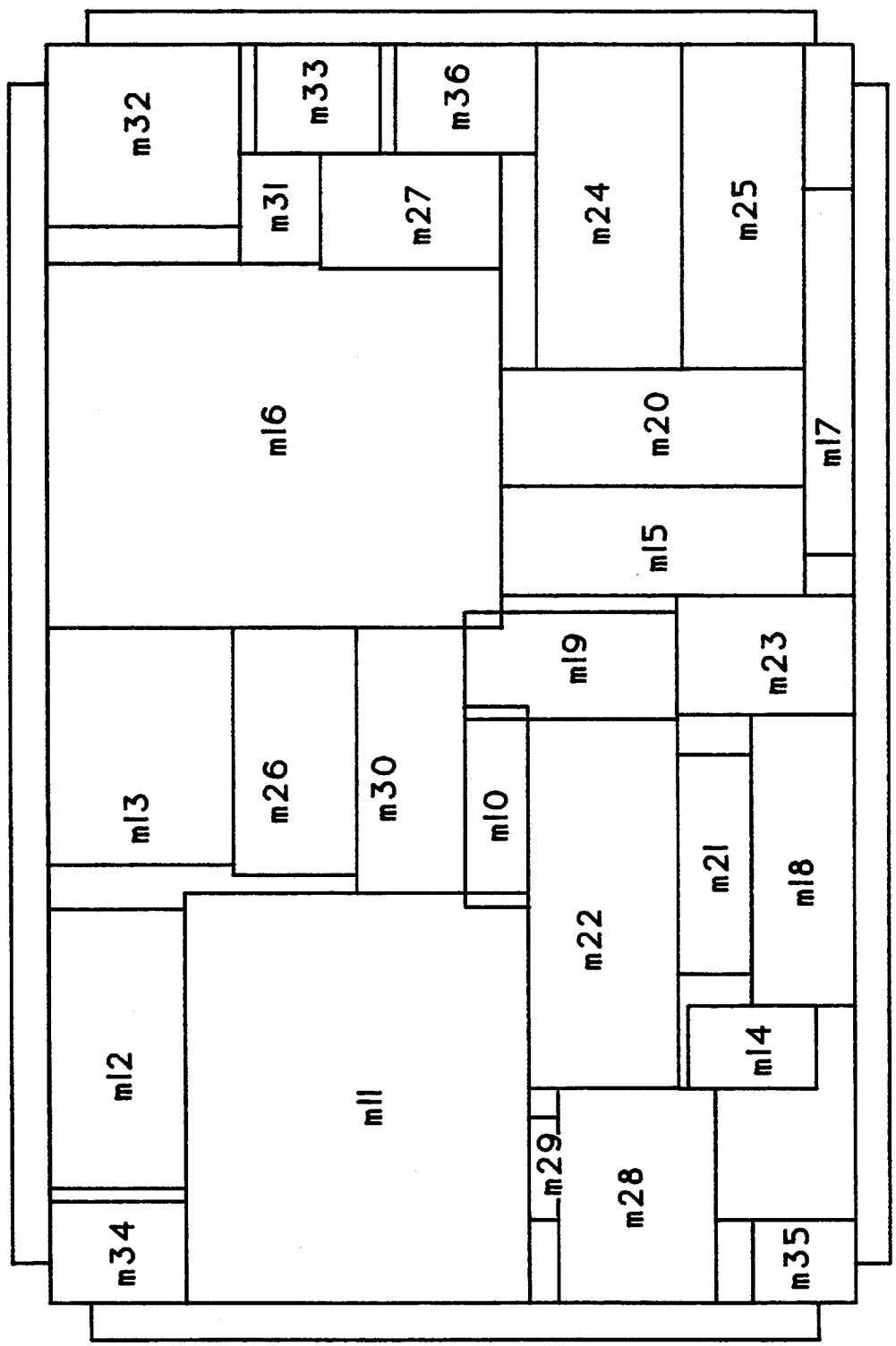
FIG. 17 depicts one example of the chip layout of FIG. 16 after the move and reshape operations have been performed in accordance with the principles of the present invention.

In this example, the threshold count was set to 250 iterations and during those iterations, a number of move and reshape operations were performed in order to reduce the amount of overlaps. The resulting layout is depicted in FIG. 17. As shown, the amount of total overlap was reduced by using move and reshape.

After the 250 iterations were completed, the remaining overlaps were eliminated by using the fitting process which was described above. The resulting legal layout is shown in FIG. 18.

In accordance with the principles of the present invention, when the density of a module within the chip reaches a certain limit, the minimum area requirement for that module may be relaxed. In this chip, as a result of performing indenting and protruding, one module, $m_{19}$ received only 99 percent of its area, instead of 100 percent. Thus, the minimum area requirement for this module was relaxed. Since this was acceptable to the designer, the plan was considered satisfactory.

Figure 18:
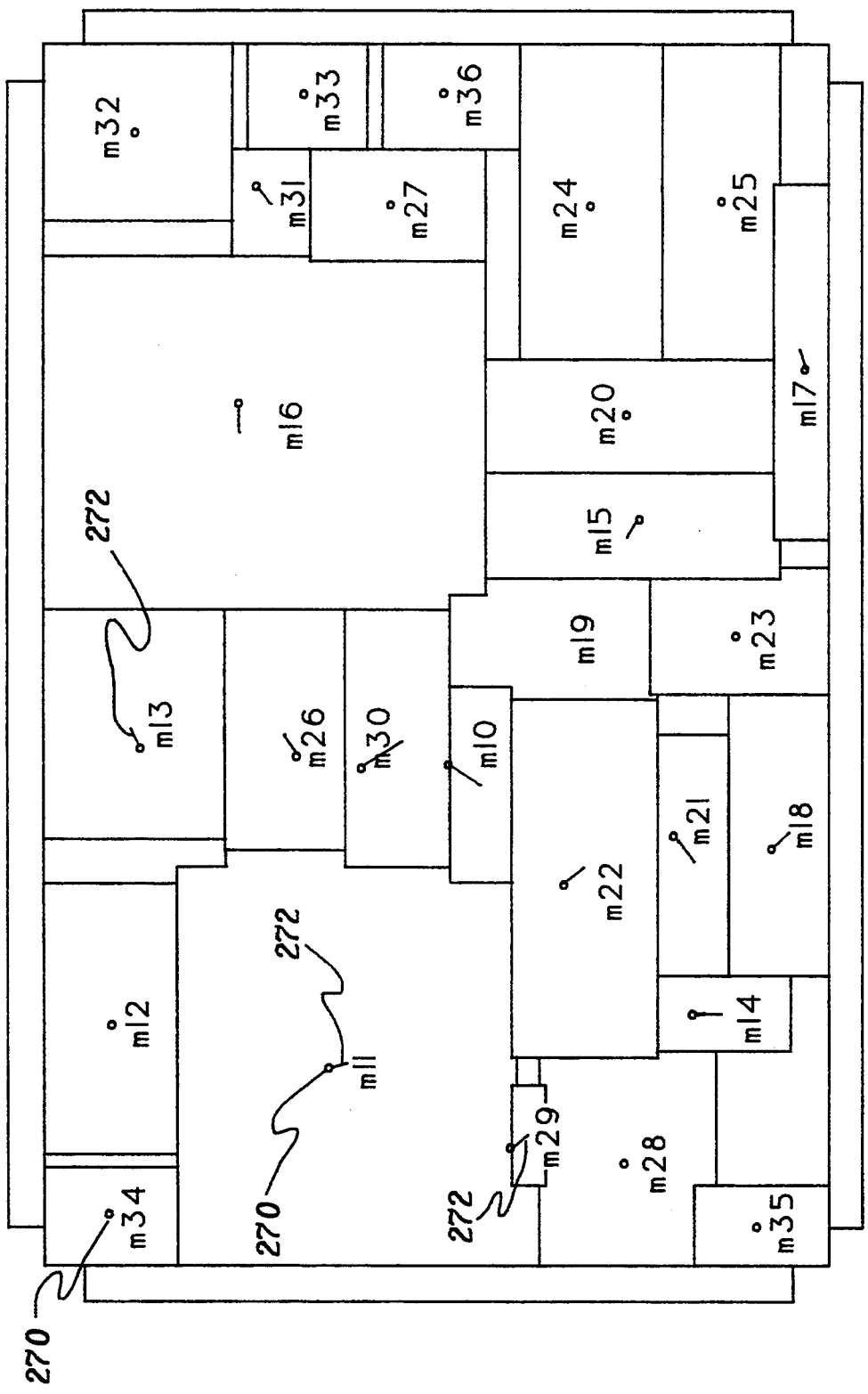
FIG. 18 depicts a final legal chip layout resulting from the fitting process of the present invention.

The amount that a given module was moved from its original position is illustrated in FIG. 18. The position depicted at reference numeral 270 indicates the original position of the module and the line extending from original position 270 (see reference numeral 272) indicates the new location of the center point of a module. As can be seen, although the modules have moved, the neighborhood relationship of the initial layout has been preserved in the final layout.

Although a preferred embodiment has been depicted and described in detail herein, it will be apparent to those skilled in the relevant art the various modifications, additions, substitutions and the like can be made without departing from the spirit of the invention, and these are therefore considered to be within the scope of the invention as recited in the appended claims.

What is claimed is:

1. A method for legalizing a valid floor plan within a defined area having a plurality of modules including overlapping modules, said method comprising the steps of:
   (a) repetitively performing at least one of a move operation or a reshape operation on each overlapping module in order to reduce the amount of total overlap among the plurality of modules; and
   (b) fitting each remaining overlapping module into the plan by at least one of indenting or protruding until a legal floor plan results therefrom;

wherein step (a) includes the steps of:
- (c) performing at least one plurality of move operations so as to produce a variety of modified floor plans;
- (d) selecting which of the modified floor plans in the variety has the least amount of overlap; and
- (e) performing a reshape operation on the selected modified floor plan; and
    wherein step (c) includes the step of saving from each plurality of move operations the modified floor plan having the least amount of overlap and wherein step (d) includes the step of selecting from the saved floor plans the plan having the least amount of overlap.

2. The method of claim 1, wherein the extent of each of said move operation and said reshape operation varies according to a computed net repelling force for each overlapping module, the magnitude and direction of which for any particular module is dependent upon the location and severity of the overlaps affecting that module.

3. The method of claim 2, wherein said computed net repelling force has a net horizontal component and a net vertical component which components are determined by the steps of:
- (f) calculating a set of repelling forces for each overlapping module, each of said repelling forces within said set having a horizontal component with a magnitude and a direction and a vertical component with a magnitude and a direction;
- (g) determining a maximum horizontal component, a minimum horizontal component, a maximum vertical component and a minimum vertical component from each set of repelling forces;
- (h) using said maximum and minimum horizontal components to calculate said net horizontal component of the net repelling force; and
- (i) using said maximum and minimum vertical components to calculate said net vertical component of the net repelling force.

4. The method of claim 3, wherein said set of repelling forces includes a number of repelling forces equal to the number of overlapped neighbors of said overlapping module.

5. The method of claim 4, wherein the magnitude of said horizontal component of step (f) represents one of a value of zero or a value equal to a predetermined portion of a width of said overlap, and wherein the magnitude of said vertical component of step (f) represents one of a value of zero or a value equal to said predetermined portion of a height of said overlap.

6. The method of claim 5, wherein said predetermined portion is equal to one half.

7. The method of claim 6, wherein said performing step (a) includes the step of performing a guard operation after each of said move operation and said reshape operation.

8. The method of claim 7, wherein the extent of said guard operation varies according to said computed net repelling force, and wherein said predetermined portion is equal to one.

9. The method of claim 8, wherein the value of zero is selected for the magnitude of said horizontal component when the absolute value of the magnitude of said vertical component is less than the absolute value of the magnitude of said horizontal component.

10. The method of claim 9, wherein the value of zero is selected for the magnitude of said vertical component when the absolute value of the magnitude of said horizontal component is less than the absolute value of the magnitude of said vertical component.

11. The method of claim 10, wherein the direction of said horizontal component is determined relative to a center point of the module and a center point of the overlap such that when the module center point is to the left of the overlap center point said horizontal component is in a negative direction and when the module center point is to the right of the overlap center point said horizontal component is in a positive direction.

12. The method of claim 11, wherein the direction of said vertical component is determined relative to the module center point and the overlap center point such that when the module center point is above the overlap center point, said vertical component is in a positive direction and when the module center point is below the overlap center point, said vertical component is in a negative direction.

13. The method of claim 12, wherein said net horizontal component of step (h) is calculated using one of a first horizontal formula or a second horizontal formula, wherein said first horizontal formula includes adding said maximum horizontal component and said minimum horizontal component to obtain said net horizontal component and wherein said second horizontal formula includes selecting a stronger horizontal component between said maximum horizontal component and said minimum horizontal component to obtain said net horizontal component.

14. The method of claim 13, wherein said first horizontal formula is selected when the product of said maximum horizontal component and said minimum horizontal component is less than or equal to zero.

15. The method of claim 14, wherein said net vertical component of step (i) is calculated using at least one of a first vertical formula or a second vertical formula, wherein said first vertical formula includes adding said maximum vertical component and said minimum vertical component to obtain said net vertical component, and wherein said second vertical formula includes selecting a stronger vertical component between said maximum vertical component and said minimum vertical component to obtain said net vertical component.

16. The method of claim 15, wherein said first vertical formula is selected when the product of said maximum vertical component and said minimum vertical component is less than or equal to zero.

17. The method of claim 1, wherein said fitting step includes the step of calculating a plurality of attracting forces for each of said remaining overlapping modules.

18. The method of claim 17, wherein said attracting forces calculating step includes the steps of:
    determining a plurality of modules attracted to each of said remaining overlapping modules; and
    calculating a gravitational medium for each of said attracted modules.

19. The method of claim 18, wherein said determining step includes the steps of:
    defining a rectangle cross section for each of said overlapping modules such that a number of regions is defined for each of said overlapping modules;
    identifying all modules located wholly or partially within each region; and
    determining which of said modules within each region are distant modules.

20. The method of claim 19, wherein the step of calculating a gravitational medium includes computing one or more coordinates for each area of space existing between an overlapping module and each of said attracted modules within each of said regions.

21. The method of claim 20, wherein said computing step further includes calculating a length for each computed medium.

22. The method of claim 21, further comprising constructing a polar graph for each of said regions wherein each of said polar graphs includes all modules associated with said region.

23. The method of claim 22, wherein said constructing step further includes the step of simplifying each of said graphs such that a medium incapable of being used for protruding is eliminated.

24. The method of claim 23, wherein said simplifying step includes the steps of:
arc removing;
arc thinning; and
arc spawning.

25. The method of claim 17, wherein said indenting step includes the steps of:
determining a set of overlap areas for each of said remaining overlapping modules;
determining whether a given overlapping module needs space;
determining which, if any, of the overlap areas associated with said given overlapping module are available for awarding to said given module; and
awarding said available overlap areas to said given module to reduce the amount of space needed by said given module.

26. The method of claim 25, wherein said indenting step further includes the steps of:
calculating the value of neediness of each needy module;
determining which needy module has the greatest neediness value; and
awarding said available overlap area to said module having the greatest neediness value.

27. The method of claim 26, further comprising determining whether said given module needs space after said indenting is complete and, if so, protruding said given module into adjoining gravitational media until its need is satisfied.

28. The method of claim 1, wherein said legal floor plan has no overlapping modules.

29. A system for legalizing a valid floor plan within a defined area having a plurality of modules including overlapping modules, said system comprising:
means for repetitively performing at least one of a move operation or a reshape operation on each overlapping module in order to reduce the amount of total overlap among the plurality of modules; and
means for fitting each remaining overlapping module into the plan by at least one of indenting or protruding until a legal floor plan results therefrom;
wherein said performing means includes:
producing means for performing at least one group of move operations so as to produce a variety of floor plans;
means for selecting which of the modified floor plans in the variety has the least amount of overlap; and
reshape means for performing a reshape operation on the selected modified floor plan; and
wherein said producing means includes means for saving from each plurality of move operations the modified floor plan having the least amount of overlap and wherein the selecting means includes means for selecting from the saved floor plans the plan having the least amount of overlap.

30. The system of claim 29, wherein said performing means includes means for computing a net repelling force and means for varying the extent of each of said move operation and said reshape operation according to said computed net repelling force for each overlapping module, the magnitude and direction of which for any particular module is dependent upon the location and severity of the overlaps affecting that module.

31. The system of claim 30, wherein said computing means includes means for computing a net horizontal component and a net vertical component, said means including:
means for calculating a set of repelling forces for each overlapping module, each of said repelling forces within said set having a horizontal component with a magnitude and a direction and a vertical component with a magnitude and a direction;
means for determining a maximum horizontal component, a minimum horizontal component, a maximum vertical component and a minimum vertical component from each set of repelling forces;
means for using said maximum and minimum horizontal components to calculate said net horizontal component of the net repelling force; and
means for using said maximum and minimum vertical components to calculate said net vertical component of the net repelling force.

32. The system of claim 31, wherein said means for calculating a set of repelling forces includes means for calculating a number of repelling forces equal to the number of overlapped neighbors of said overlapping module.

33. The system of claim 32, wherein the magnitude of said horizontal component represents one of a value of zero or a value equal to a predetermined portion of a width of said overlap, and wherein the magnitude of said vertical component represents one of a value of zero or a value equal to said predetermined portion of a height of said overlap.

34. The system of claim 33, wherein said predetermined portion is equal to one half.

35. The system of claim 34, wherein said performing means includes means for performing a guard operation after each of said move operation and said reshape operation.

36. The system of claim 35, wherein the extent of said guard operation varies according to said computed net repelling force, and wherein said predetermined portion is equal to one.

37. The system of claim 36, wherein the value of zero is selected for the magnitude of said horizontal component when the absolute value of the magnitude of said vertical component is less than the absolute value of the magnitude of said horizontal component.

38. The system of claim 37, wherein the value of zero is selected for the magnitude of said vertical component when the absolute value of the magnitude of said horizontal component is less than the absolute value of the magnitude of said vertical component.

39. The system of claim 38, wherein the direction of said horizontal component is determined relative to a center point of the module and a center point of the overlap such that when the module center point is to the left of the overlap center point said horizontal component is in a negative direction and when the module center point is to the right of the overlap center point said horizontal component is in a positive direction.

40. The system of claim 39, wherein the direction of said vertical component is determined relative to the module center point and the overlap center point such that when the module center point is above the overlap center point, said vertical component is in a positive direction and when the module center point is below the overlap center point, said vertical component is in a negative direction.

41. The system of claim 40, wherein said net horizontal component is calculated using one of a first horizontal formula or a second horizontal formula, wherein said first horizontal formula includes adding said maximum horizontal component and said minimum horizontal component to obtain said net horizontal component and wherein said second horizontal formula includes selecting a stronger horizontal component between said maximum horizontal component and said minimum horizontal component to obtain said net horizontal component.

42. The system of claim 41, wherein said first horizontal formula is selected when the product of said maximum horizontal component and said minimum horizontal component is less than or equal to zero.

43. The system of claim 42, wherein said net vertical component is calculated using at least one of a first vertical formula or a second vertical formula, wherein said first vertical formula includes adding said maximum vertical component and said minimum vertical component to obtain said net vertical component, and wherein said second vertical formula includes selecting a stronger vertical component between said maximum vertical component and said minimum vertical component to obtain said net vertical component.

44. The system of claim 43, wherein said first vertical formula is selected when the product of said maximum vertical component and said minimum vertical component is less than or equal to zero.

45. The system of claim 29, wherein said fitting means includes attracting means for calculating a plurality of attracting forces for each of said remaining overlapping modules.

46. The system of claim 45, wherein said attracting means includes:
   overlap means for determining a plurality of modules attracted to each of said remaining overlapping modules; and
   medium means for calculating a gravitational medium for each of said attracted modules.

47. The system of claim 46, wherein said overlap means includes:
   rectangle means for defining a rectangle cross section for each of said overlapping modules such that a number of regions is defined for each of said overlapping modules;
   means for identifying all modules located wholly or partially within each region; and
   means for determining which of said modules within each region are distant modules.

48. The system of claim 47, wherein said medium means includes coordinate means for computing one or more coordinates for each area of space existing between an overlapping module and each of said attracted modules within each of said regions.

49. The system of claim 48, wherein said coordinate means further includes means for calculating a length for each computed medium.

50. The system of claim 49, further comprising constructing means for constructing a polar graph for each of said regions wherein each of said polar graphs includes all modules associated with said region.

51. The system of claim 50, wherein said constructing means further includes simplifying means for simplifying each of said graphs such that a medium incapable of being used for protruding is eliminated.

52. The system of claim 51, wherein said simplifying means includes:
   means for arc removing;
   means for arc thinning; and
   means for arc spawning.

53. The system of claim 45, wherein said indenting includes:
   area means for determining a set of overlap areas for each of said remaining overlapping modules;
   means for determining whether a given overlapping module needs space;
   means for determining which, if any, of the overlap areas associated with said given overlapping module are available for awarding to said given module; and
   means for awarding said available overlap areas to said given module to reduce the amount of space needed by said given module.

54. The system of claim 53, wherein said indenting further includes:
   means for calculating a value of neediness of each needy module;
   means for determining which needy module has a greatest neediness value; and
   means for awarding said available overlap area to said module having the greatest neediness value.

55. The system of claim 54, further comprising means for determining whether said given module needs space after said indenting is complete and, if so, protruding said given module into adjoining gravitational media until its need is satisfied.

* * * * *

UNITED STATES PATENT AND TRADEMARK OFFICE
CERTIFICATE OF CORRECTION

PATENT NO. : 5,398,195

DATED : March 14, 1995

INVENTOR(S) : Michelle Y. Kim

It is certified that error appears in the above-indentified patent and that said Letters Patent is hereby corrected as shown below:

Title Page:
Item [21], Application No., delete "810,260" and replace with --840,260--.
Col. 6, line 12, delete "they" and replace with --the y--.
Col. 7, line 30, delete "and $F_x:=0$" and replace with --and $F_y:=0$--.
Col. 7, line 67, delete "assumes" and replace with --assume--.
Col. 10, line 15, delete "force,." and replace with --force,--.
Col. 13, line 60, delete "of $m_i$" and replace with --of $m_j$--.
Col. 14, line 10, delete "(-" and replace with --(--.
Col. 14, line 22, delete "min(-" and replace with --min(--.
Col. 14, line 31, delete "(mediums$_{i,j}$)" and replace with --medium$_{i,j}$)--.
Col. 14, line 33, delete "mediums$_{i,j}$" and replace with --medium$_{i,j}$--.
Col. 14, line 38, delete "min(-" and replace with --min(--.
Col. 14, line 59, delete "$m_j \overset{<}{=} m_k$" and replace with --$m_j \overset{<}{=} m_k$ --.
Col. 14, line 61, delete "$m_j \overset{<}{=} m_k$" and replace with --$m_j \overset{<}{=} m_k$ --.
Col. 14, line 65, delete "$m_j \overset{<}{=} m_k$" and replace with --$m_j \overset{<}{=} m_k$ --.
Col. 15, line 15, delete "($\overset{<}{=}$)" and replace with --($\overset{<}{=}$)--.
Col. 15, line 43, delete "$m_j \overset{<}{=} m_k$" and replace with --$m_j \overset{<}{=} m_k$--.
Col. 15, line 33, delete "medium$_{1,3}$" and replace with --medium$_{1,2}$--.
Col. 16, line 54, delete "relation =," and replace with --relation$\overset{<}{=}$,--.

UNITED STATES PATENT AND TRADEMARK OFFICE
CERTIFICATE OF CORRECTION

PATENT NO.   : 5,398,195
DATED        : March 14, 1995
INVENTOR(S)  : Michelle Y. Kim It is certified that error appears in the above-indentified patent and that said Letters Patent is hereby corrected as shown below:

Claim 1, Col. 20, line 67, delete "the plan" and replace with --the floor plan--.
Claim 1, Col. 21, line 13, delete "saved floor" and replace with --saved modified floor--.
Claim 1, Col. 21, line 13, delete "the plan" and replace with --the modified floor plan--.
Claim 25, Col. 23, line 21, delete "step includes" and replace with --includes--.
Claim 26, Col. 23, line 33, delete "step further" and replace with --further--.
Claim 29, Col. 23, line 56, delete "the plan" and replace with --the floor plan--.
Claim 29, Col. 23, line 60, delete "of floor" and replace with --of modified floor--.
Claim 29, Col. 24, line 2, delete "saved floor" and replace with --saved modified floor--.
Claim 29, Col. 24, line 3, delete "the plan" and replace with --the modified floor plan--.

Signed and Sealed this

Fourteenth Day of November, 1995

*Attest:*

BRUCE LEHMAN

*Attesting Officer*        *Commissioner of Patents and Trademarks*